United States Patent
Kato et al.

(10) Patent No.: US 10,812,099 B2
(45) Date of Patent: Oct. 20, 2020

(54) AD CONVERTER AND IMAGE SENSOR

(71) Applicant: OLYMPUS CORPORATION, Hachioji-shi, Tokyo (JP)

(72) Inventors: Hideki Kato, Tokyo (JP); Yasunari Harada, Ebina (JP); Shuzo Hiraide, Tokyo (JP); Masato Osawa, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 262 days.

(21) Appl. No.: 16/106,687

(22) Filed: Aug. 21, 2018

(65) Prior Publication Data

US 2018/0358977 A1 Dec. 13, 2018

Related U.S. Application Data

(63) Continuation of application No. PCT/JP2016/059860, filed on Mar. 28, 2016.

(51) Int. Cl.
*H03M 1/46* (2006.01)
*H04N 5/378* (2011.01)
*H03M 1/12* (2006.01)

(52) U.S. Cl.
CPC ............ *H03M 1/466* (2013.01); *H03M 1/468* (2013.01); *H04N 5/378* (2013.01); *H03M 1/123* (2013.01)

(58) Field of Classification Search
CPC .......... H03M 1/12; H03M 1/38; H03M 1/466; H03M 1/468

(Continued)

(56) References Cited

U.S. PATENT DOCUMENTS 9,467,161 B1 * 10/2016 Kim ...................... H03M 1/145
10,505,558 B2 * 12/2019 Yagishita ................ H03M 1/38
(Continued)

FOREIGN PATENT DOCUMENTS

JP 61-126823 A 6/1986
JP 2007-142863 A 6/2007
(Continued)

OTHER PUBLICATIONS

International Search Report dated Jun. 7, 2016, issued in counterpart International Application No. PCT/JP2016/059860, w/English translation (4 pages).

(Continued)

*Primary Examiner* — Kevin K Pyo
(74) *Attorney, Agent, or Firm* — Westerman, Hattori, Daniels & Adrian, LLP

(57) ABSTRACT

In an AD converter, a first capacitor DAC circuit performs a first operation in parallel with a second operation by a second capacitor DAC circuit, and the first capacitor DAC circuit performs the second operation in parallel with the first operation by the second capacitor DAC circuit. Electric charge corresponding to an input signal is sampled in the first operation. AD conversions are sequentially performed on the basis of the electric charge sampled in each first capacitor included in a plurality of first capacitors or each second capacitor included in a plurality of second capacitors in the second operation. The first capacitor DAC circuit and the second capacitor DAC circuit alternately perform the first operation and the second operation.

2 Claims, 9 Drawing Sheets

(58) Field of Classification Search
USPC ................ 250/214 R, 214 DC; 341/158, 172
See application file for complete search history.

(56) References Cited

U.S. PATENT DOCUMENTS

| | | | |
|---|---|---|---|
| 10,700,697 B2 * | 6/2020 | Osawa ................. | H04N 9/0455 |
| 2007/0115159 A1 | 5/2007 | Tachibana et al. | |
| 2010/0151900 A1 | 6/2010 | Koli | |

FOREIGN PATENT DOCUMENTS

| | | |
|---|---|---|
| JP | 2011-188240 A | 9/2011 |
| JP | 2012-065167 A | 3/2012 |
| JP | 2014-042358 A | 3/2014 |
| JP | 2015-211259 A | 11/2015 |
| JP | 2015-211391 A | 11/2015 |

OTHER PUBLICATIONS

Office Action dated Feb. 4, 2020, issued in counterpart JP application No. 2018-507828, with English translation. (3 pages).

* cited by examiner

AD CONVERTER AND IMAGE SENSOR

The present application is a continuation application based on International Patent Application No. PCT/JP 2016/059860 filed on Mar. 28, 2016, the content of which is incorporated herein by reference.

BACKGROUND OF THE INVENTION

Field of the Invention

The present invention relates to an analog-to digital (AD) converter and an image sensor.

Description of Related Art

For example, a successive approximation AD converter according to a conventional technology is disclosed in Japanese Unexamined Patent Application, First Publication No. S61-126823. In this successive approximation AD converter, an analog input signal is sampled and is stored in a capacitor. An AD conversion is performed one bit at a time on the basis of the analog input signal stored in the capacitor.

SUMMARY OF THE INVENTION

According to a first aspect of the present invention, an AD converter includes a first capacitor DAC circuit, a second capacitor DAC circuit, a selection circuit, a comparison circuit, a control circuit, and a connection switch. The first capacitor DAC circuit includes a plurality of first capacitors having weighted capacitance values. A differential signal is input from a first node and a second node to the first capacitor DAC circuit. The second capacitor DAC circuit includes a plurality of second capacitors having weighted capacitance values. The differential signal is input from the first node and the second node to the second capacitor DAC circuit at a timing different from a timing at which the differential signal is input to the first capacitor DAC circuit. The selection circuit selects one of the first capacitor DAC circuit and the second capacitor DAC circuit. The selection circuit performs switching between a first state in which the first capacitor DAC circuit is selected and a second state in which the second capacitor DAC circuit is selected. The comparison circuit has a first input terminal and a second input terminal respectively connected to a first output node and a second output node of one of the first capacitor DAC circuit and the second capacitor DAC circuit through the selection circuit and compares an electric potential of the first output node with an electric potential of the second output node. The control circuit controls the first capacitor DAC circuit and the second capacitor DAC circuit in accordance with a result of the comparison performed by the comparison circuit. The connection switch is switched between on and off, connects the first node and the first input terminal when being on, and connects the second node and the second input terminal when being off. The first capacitor DAC circuit performs a first operation in parallel with a second operation by the second capacitor DAC circuit, and the first capacitor DAC circuit performs the second operation in parallel with the first operation by the second capacitor DAC circuit. Electric charge corresponding to an input signal for the first capacitor DAC circuit or the second capacitor DAC circuit is sampled in each first capacitor included in the plurality of first capacitors or each second capacitor included in the plurality of second capacitors in the first operation. AD conversions are sequentially performed on the basis of the electric charge sampled in each first capacitor included in the plurality of first capacitors or each second capacitor included in the plurality of second capacitors in the second operation. The first capacitor DAC circuit and the second capacitor DAC circuit alternately perform the first operation and the second operation. The selection circuit selects a capacitor DAC circuit performing the second operation out of the first capacitor DAC circuit and the second capacitor DAC circuit. The connection switch is turned on between the first operation and the second operation and performs a reset operation of applying a reference voltage to the first input terminal and the second input terminal.

According to a second aspect of the present invention, in the first aspect, an image sensor includes an AD converter and a plurality of pixels. The plurality of pixels are disposed in a matrix pattern. The plurality of pixels output signals. The differential signal based on the signals output from the plurality of pixels is input to the AD converter.

DETAILED DESCRIPTION OF THE INVENTION

Embodiments of the present invention will be described with reference to the drawings.

First Embodiment

Figure 1:
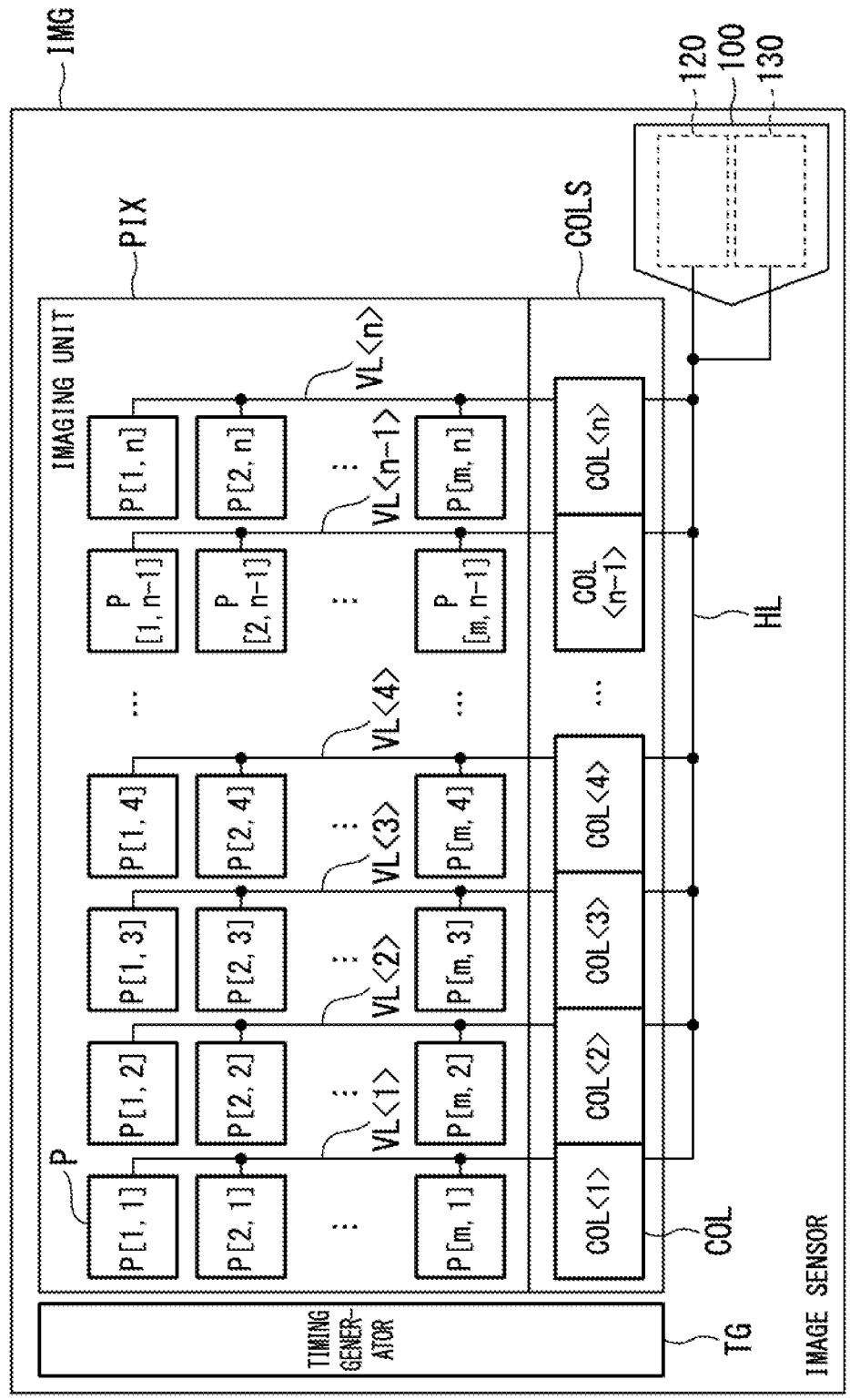
FIG. 1 is a block diagram showing the entire configuration of an image sensor according to a first embodiment of the present invention.

The entire configuration of an image sensor IMG according to a first embodiment of the present invention will be described with reference to FIG. 1. FIG. 1 shows the entire configuration of the image sensor IMG. As shown in FIG. 1, the image sensor IMG includes an imaging unit PIX, a timing generator TG, a column processing unit COLS, and an AD converter 100.

The imaging unit PIX includes a plurality of pixels P disposed in a matrix pattern. In FIG. 1, some of the plurality of pixels P are not shown. In a case in which a pixel P needs to be distinguished from the others, the pixel P is represented using a row number m and a column number n. Here, m and n are arbitrary integers of two or more. A pixel P disposed in the i-th row and the j-th column is a pixel P[i, j]. Here, i is an integer that is one or more and m or less. In addition, j is an integer that is one or more and n or less. The imaging unit PIX includes m×n pixels P[1, 1] to P[m, n]. In addition, n vertical signal lines VL<1> to VL<n> are disposed in a column direction. The pixels P[1, 1] to P[m, n] are connected to the vertical signal lines VL<1> to VL<n> for each column. In other words, the pixels P[1, j] to P[m, j] of the j-th column are connected to the vertical signal line VL<j>. Each pixel P outputs a reset signal at the time of resetting the pixel P and outputs a video signal corresponding to light incident on the pixel P to the column processing unit COLS. The pixel P includes a photodiode and accumulates a signal corresponding to light incident on the pixel P in the photodiode. The pixel P outputs a video signal based on the signal accumulated in the photodiode to the column processing unit COLS.

The column processing unit COLS includes a plurality of column circuits COL disposed for each column of a plurality of pixels P. In FIG. 1, some of the plurality of column circuits COL are not shown. In a case in which a column circuit COL needs to be distinguished from the others, the column circuit COL is represented using a column number n. A column circuit COL disposed in the j-th column is a column circuit COL<j>. The column processing unit COLS includes n column circuits COL<1> to COL<n>. The column circuits COL<1> to COL<n> are respectively disposed for the vertical signal lines VL<1> to VL<n>. The column circuit COL<j> of the j-th column is connected to the vertical signal line VL<j>. Reset signals and video signals output from the pixels P[1, j] to P[m, j] of the j-th column are input to the column circuit COL<j> of the j-th column. The column circuits COL<1> to COL<n> are connected to the AD converter 100 through a horizontal signal line HL. The column circuits COL<1> to COL<n> cancel out reset noise and the like included in the video signals output from the pixels P[1, 1] to P[m, n]. Accordingly, the column circuits COL<1> to COL<n> generate video signals VSIG and output the video signals VSIG to the AD converter 100.

The AD converter 100 is connected to the horizontal signal line HL. The AD converter 100 converts video signals VSIG (analog signals) output from the column circuits COL<1> to COL<n> into digital signals. The AD converter 100 includes a first capacitor digital-to-analog converter (DAC) circuit 120 and a second capacitor DAC circuit 130 in input terminals.

The timing generator TG is connected to the imaging unit PIX, the column processing unit COLS, and the AD converter 100 through signal lines that are not shown in the drawing. The timing generator TG supplies a signal required for controlling the image sensor IMG to each unit.

The timing generator TG supplies a row selection signal RSEL<1> to a pixel P[1, 1] to a pixel P[1, n] of the first row and supplies a row selection signal RSEL<m> to a pixel P[m, 1] to a pixel P[m, n] of the m-th row. The timing generator TG also supplies similar signals to pixels P of the other rows. In a case in which a row selection signal RSEL<i> is "L (low)," a pixel P[i, 1] to a pixel P[i, n] to which a row selection signal RSEL<i> is supplied are not connected to vertical signal lines VL<1> to VL<n>. On the other hand, in a case in which the row selection signal RSEL<i> is "H (high)," the pixel P[i, 1] to the pixel P[i, n] to which the row selection signal RSEL<i> is supplied are connected to the vertical signal lines VL<1> to VL<n>.

The timing generator TG supplies a control signal CLP_R and a control signal CLP_S to the column circuits COL<1> to COL<n>. The control signal CLP_R is a control signal used for the column circuits COL<1> to COL<n> to sample a reset signal output from a pixel P. At a timing at which a reset signal is output from the pixel P, the control signal CLP_R changes to "H." At this time, the column circuits COL<1> to COL<n> sample the reset signal. When the control signal CLP_R changes to "L," the sampling operation ends.

The control signal CLP_S is a control signal used for the column circuits COL<1> to COL<n> to sample a video signal output from a pixel P. At a timing at which the video signal is output from the pixel P, the control signal CLP_S changes to "H." At this time, the column circuits COL<1> to COL<n> sample a video signal. When the control signal CLP_S changes to "L," the sampling operation ends.

The timing generator TG respectively supplies column selection signals CSEL<1> to CSEL<n> to the column circuits COL<1> to COL<n>. When the column selection signals CSEL<1> to CSEL<n> change to "H," the column circuits COL<1> to COL<n> are connected to the horizontal signal line HL. At this time, each of the column circuits COL<1> to COL<n> outputs a video signal VSIG<x> based on a difference VPIX<x> between a reset signal and a video signal to the AD converter 100. Here, x is an integer that is "1" or more and "n" or less. The video signal VSIG<x> is a signal a reference of which is the electric potential of a reference signal VREF.

The video signal VSIG is represented using Equation (1). The video signal VSIG has a negative polarity.

$$VSIG = VREF - VPIX<x> \quad (1)$$

For example, in a case in which a signal supplied from a pixel P is at a minimum level (black level), the video signal VSIG is represented using Equation (2). On the other hand, in a case in which a signal supplied from the pixel P is at a maximum level (saturated level), the video signal VSIG is represented using Equation (3). In Equation (3). VPIX_SAT is a saturated (maximum) voltage of VPIX.

$$VSIG = VREF - 0 \quad (2)$$

$$VSIG = VREF - VPIX\_SAT \quad (3)$$

In the example described above, the video signal VSIG has a negative polarity. However, the video signal VSIG may have a positive polarity. The image sensor IMG need not include the column processing unit COLS, and signals output from the plurality of pixels P may be input to the AD converter 100.

Figure 2:
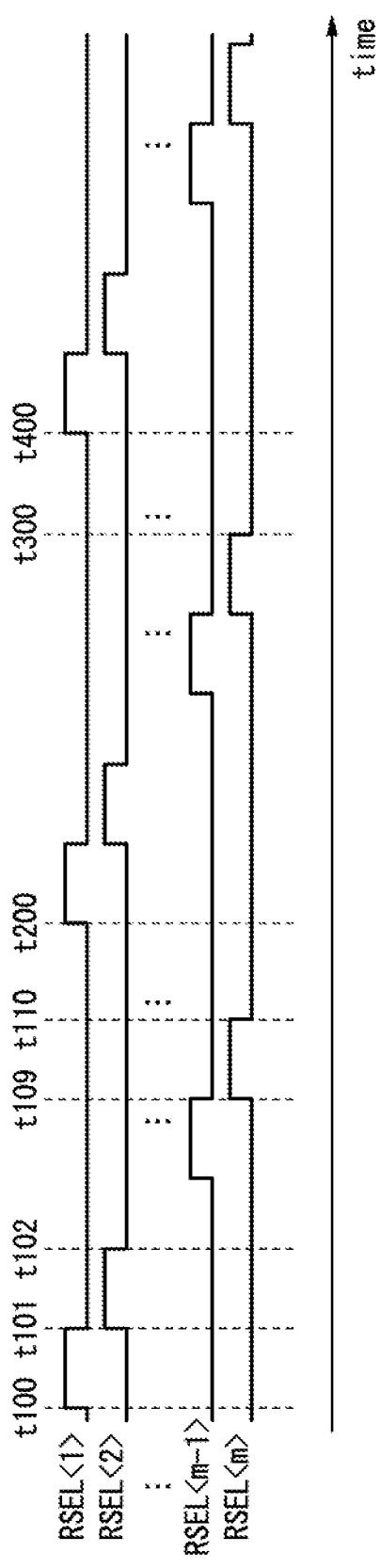
FIG. 2 is a timing diagram showing the operation of the image sensor according to the first embodiment of the present invention.
Figure 3:
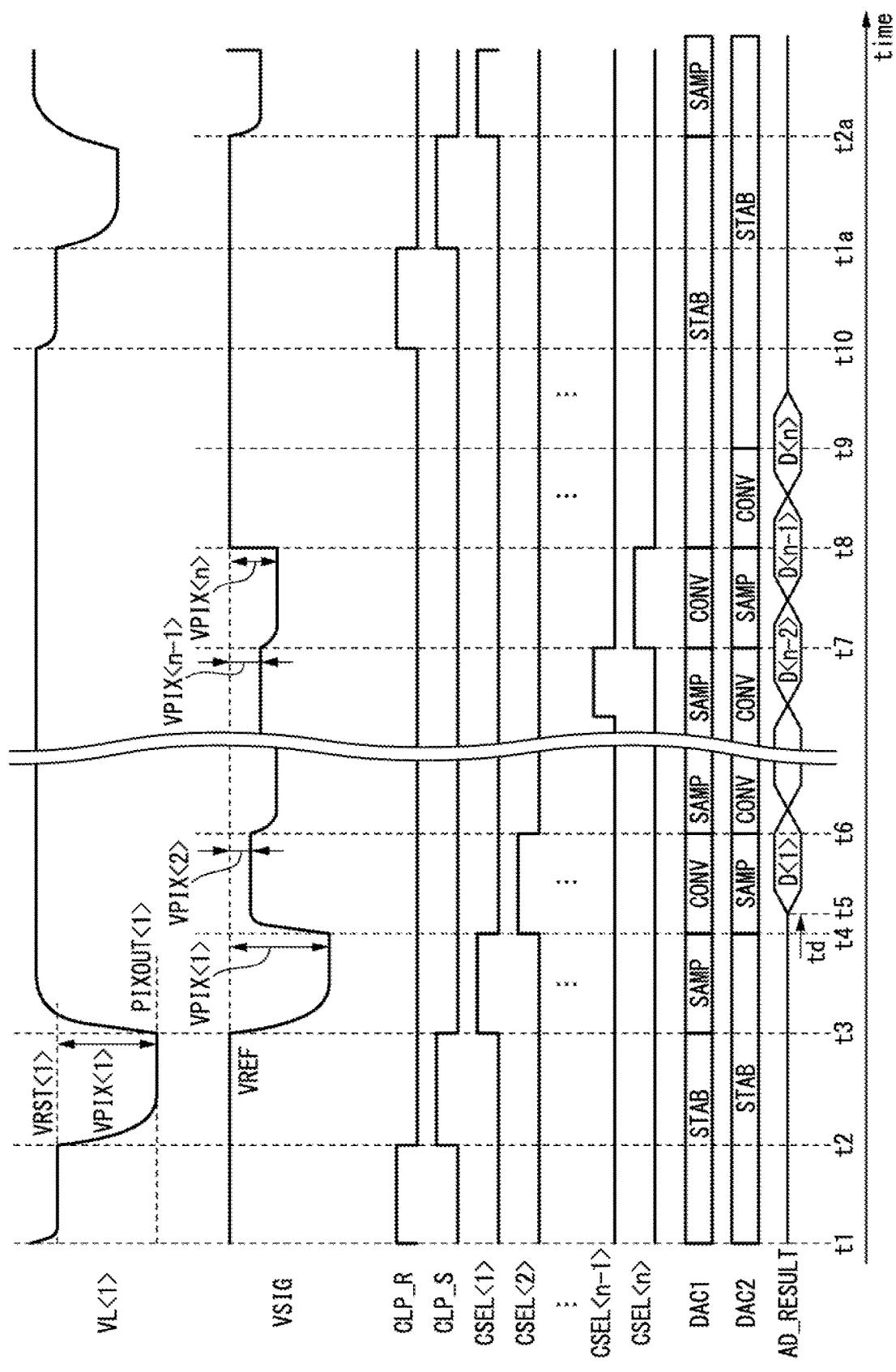
FIG. 3 is a timing diagram showing the operation of the image sensor according to the first embodiment of the present invention.

A signal reading operation by the image sensor IMG will be described in more detail with reference to FIGS. 2 and 3. FIGS. 2 and 3 show signals relating to the operation of the image sensor IMG In FIG. 2, row selection signals RSEL<1> to RSEL<m> are shown. In FIG. 3, the electric potential of a vertical signal line VL<1>, a video signal VSIG a control signal CLP_R, a control signal CLP_S, and column selection signals CSEL<1> to CSEL<n> are shown. In FIG. 3, a state of a first capacitor DAC circuit 120 (DAC1), a state of a second capacitor DAC circuit 130 (DAC2), and digital signals D<1> to D<n> of each column of an AD conversion result (AD_RESULT) are shown. In FIGS. 2 and 3, the horizontal axis represents time, and the vertical axis represents a signal level. The resolution in the time direction is different between FIGS. 2 and 3. In FIG. 2, a period of a time t100 to a time t101 corresponds to a period of time t1 to t10 shown in FIG. 3.

At the time t100, the row selection signal RSEL<1> changes to "H." The row selection signals RSEL<2> to RSEL<m> are maintained at "L." At a time t101, the row selection signal RSEL<1> changes to "L," and the row selection signal RSEL<2> changes to "H." Thereafter, row selection signals RSEL<3> to RSEL<m> of each row sequentially change to "H." At a time t109, a row selection signal RSEL<m–1> changes to "L," and a row selection signal RSEL<m> changes to "H." At a time t110, the row selection signal RSEL<m> changes to "L." Changes in the row selection signals RSEL<1> to RSEL<m> from a time t200 to a time t300 are similar to the changes in the row selection signals RSEL<1> to RSEL<m> from the time t1100 to the time t110.

Before signals supplied from the pixels P[1, 1] to P[1, n] of the first row are read at a time t1 shown in FIG. 3, the photodiodes of the pixels P[1, 1] to P[1, n] are reset to a predetermined voltage and are exposed for a predetermined time. Hereinafter, the description will focus on reading of signals supplied from the pixels P[1, 1] to P[1, n] of the first row. Reading of signals supplied from pixels P of the other rows is similar to the reading of the signals supplied from the pixels P of the first row. At a time t1, the first capacitor DAC circuit 120 and the second capacitor DAC circuit 130 are in a stopped state STAB.

At the time t1, the row selection signal RSEL<1> becomes "H," and thus the pixels P[1, 1] to P[1, n] of the first row are respectively connected to the vertical signal lines VL<1> to VL<n>. At this timing, the pixels P[1, 1] to P[1, n] respectively start to output reset signals VRST<1> to VRST<n>. Only a reset signal VRST<1> of the first column among the reset signals VRST<1> to VRST<n> of respective columns is shown in FIG. 3. At this timing, the control signal CLP_R becomes "H." Accordingly, the column circuits COL<1> to COL<n> start sampling operations of the reset signals VRST<1> to VRST<n>.

After a predetermined time elapses from the time t1, and the reset signals VRST<1> to VRST<n> are stabilized, the control signal CLP_R becomes "L" at a time t2. Accordingly, the levels of the reset signals stored in the column circuits COL<1> to COL<n> are determined. At this timing, the pixels P[1, 1] to P[1, n] start to output video signals PIXOUT<1> to PIXOUT<n>. Simultaneously the control signal CLP_S becomes "H." Accordingly, the column circuits COL<1> to COL<n> start operations of sampling the video signals PIXOUT<1> to PIXOUT<n>.

At a time t3, the control signal CLP_S becomes "L," and thus the column circuits COL<1> to COL<n> end the operations of sampling the video signals PIXOUT<1> to PIXOUT<n>. Inside the column circuits COL<1> to COL<n>, reset noise and the like of pixels included in the video signals PIXOUT<1> to PIXOUT<n> input from the pixels P[1, 1] to P[1, n] is cancelled out. The column circuits COL<1> to COL<n> store video signals VSIG having amplitudes of VPIX<1> to VPIX<n> a reference of which is the electric potential of the reference signal VREF At the time t3, the column selection signal CSEL<1> becomes "H," and thus a video signal VSIG having an amplitude VPIX<1> is output from the column circuit COL<1> of the first column. This signal is sampled by the first capacitor DAC circuit 120 of the AD converter 100. At this time, the first capacitor DAC circuit 120 starts a sampling operation SAMP.

At a time t4, the column selection signal CSEL<1> becomes "L," and the column selection signal CSEL<2> simultaneously becomes "H." Accordingly, a video signal VSIG having an amplitude VPIX<2> is output from the column circuit COL<2> of the second column. This signal is sampled by the second capacitor DAC circuit 130 of the AD converter 100. At this time, the second capacitor DAC circuit 130 starts a sampling operation SAMP. At the time t4, the first capacitor DAC circuit 120 ends the sampling operation SAMP and starts an AD conversion operation CONV. At a time t5 that is a time when a conversion time td has elapsed after the time t4, the AD converter 100 updates the AD conversion result AD_RESULT and outputs the first digital signal D<1> as the conversion result.

After the time t5, similarly, the column selection signals CSEL<3> to CSEL<n> sequentially become "H," and thus video signals VSIG are sequentially output from the column circuits COL<3> to COL<n> and are input to the AD converter 100.

The sampling operation SAMP for the video signal VSIG output from the column circuit COL<n> starts at a time t7 and ends at a time t8. The AD conversion operation CONV for the video signal VSIG output from the column circuit COL<n> starts at the time t8 and ends at a time t9.

In the operation described above, video signals VSIG output from the column circuits COL<1> to COL<n–1> of odd-numbered columns are sampled by the first capacitor DAC circuit 120 of the AD converter 100. In addition, video signals VSIG output from the column circuits COL<2> to COL<n> of even-numbered columns are sampled by the second capacitor DAC circuit 130 of the AD converter 100. In a period in which one capacitor DAC circuit performs the sampling operation SAMP, the other capacitor DAC circuit performs the AD conversion operation CONV. The sampling operation SAMP by one capacitor DAC circuit and the AD conversion operation CONV by the other capacitor DAC circuit are performed in parallel with each other. In a period in which no column circuit is selected, the capacitor DAC circuit of the AD converter 100 is in a stopped state STAB.

At a moment at which each of the column selection signals CSEL<1> to CSEL<n> is switched from "H" to "L," the AD converter 100 ends the sampling of the video signals VSIG output from the column circuit COL<i> of a column corresponding to the column selection signal CSEL<i> and starts an AD conversion. When the AD conversion ends, the AD converter 100 sequentially outputs (updates) the conversion result AD_RESULT, thereby generating a digital signal D. The digital signal D is constituted by digital data of each column represented as D<1> to D<n> in FIG. 3.

At a time t101 (corresponding to the time t10) after the end of reading from a pixel P[1, n] of the first row and the n-th column, the row selection signal RSEL<1> is switched from "H" to "L" Simultaneously, the row selection signal RSEL<2> is switched from "L" to "H." Thereafter, signals supplied from pixels P that are the pixel P[2, 1] of the second row and the first column to the pixel P[2, n] of the second row and the n-th column are read through the column circuits COL<1> to COL<n>. Thereafter, similarly, signals supplied from pixels P of the third row to the m-th row are read, and the reading ends at a time t300. After the reading of pixels P in each row ends, exposure of pixels P in each row is performed again. After the exposure ends, at a time t400, the row selection signal RSEL<1> is switched from "L" to "H." and thus reading from the pixels P[1, 1] to P[1, n] of the first row is started again.

As described above, the image sensor IMG includes an AD converter 100 and a plurality of pixels P. The plurality of pixels P are disposed in a matrix pattern. The plurality of pixels P output signals (reset signals and video signals). A differential signal based on the signals output from the plurality of pixels P is input to the AD converter 100.

Figure 4:
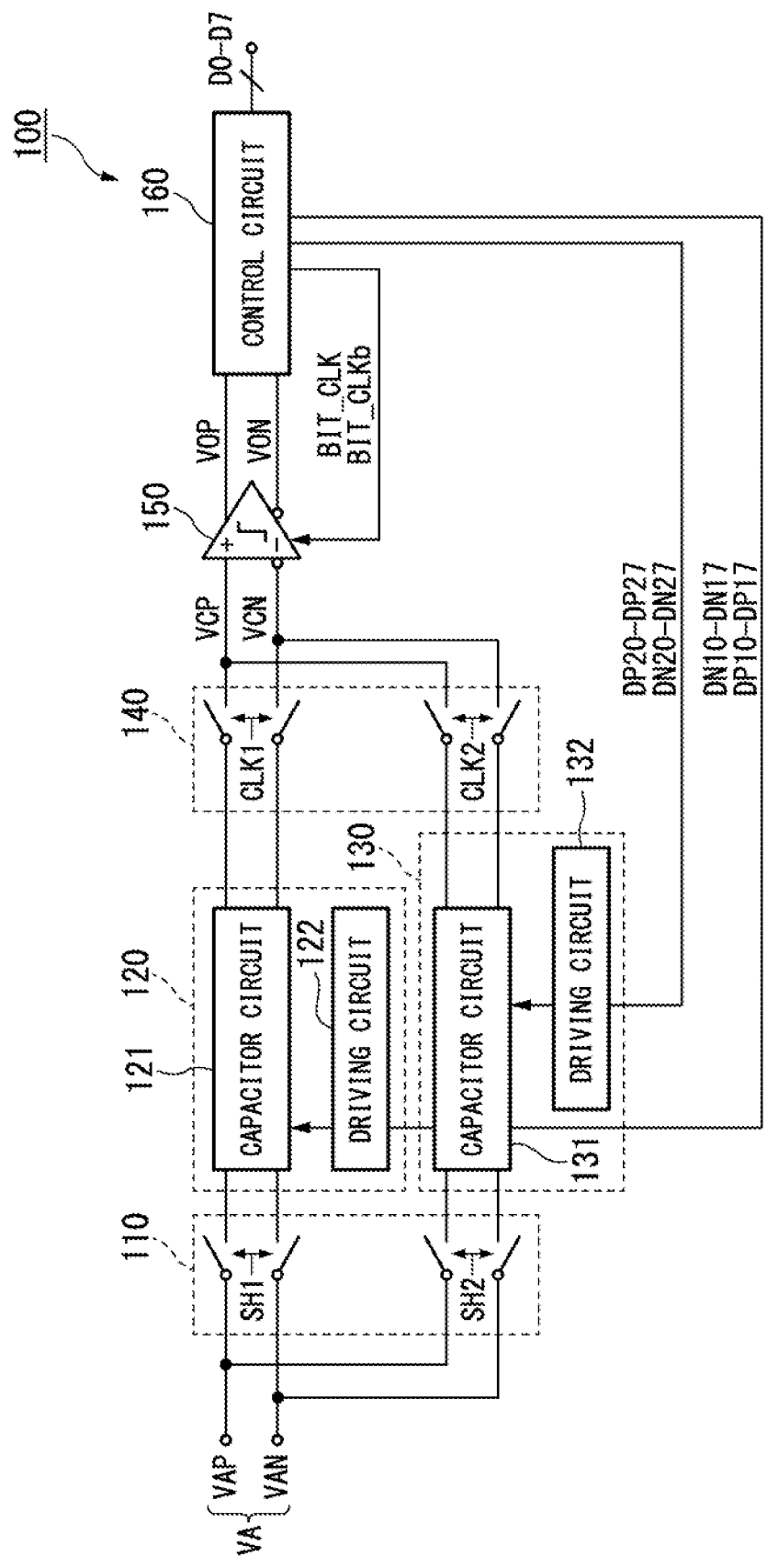
FIG. 4 is a circuit diagram showing the configuration of an AD converter according to the first embodiment of the present invention.

The configuration of the AD converter 100 will be described with reference to FIG. 4. FIG. 4 shows the configuration of the AD converter 100.

A schematic configuration of the AD converter 100 will be described. The AD converter 100, at least, includes a first capacitor DAC circuit 120, a second capacitor DAC circuit 130, a selection circuit 140, a comparison circuit 150, and a control circuit 160. The first capacitor DAC circuit 120 includes a plurality of first capacitors having weighted capacitance values. A differential signal VA is input to the first capacitor DAC circuit 120. The second capacitor DAC circuit 130 includes a plurality of second capacitors having weighted capacitance values. The differential signal VA is input to the second capacitor DAC circuit 130 at a timing different from a timing at which the differential signal VA is input to the first capacitor DAC circuit 120. The selection circuit 140 selects one of the first capacitor DAC circuit 120 and the second capacitor DAC circuit 130. The selection circuit 140 performs switching between a first state in which the first capacitor DAC circuit 120 is selected and a second state in which the second capacitor DAC circuit 130 is selected. The comparison circuit 150 is connected to a first output node and a second output node of one of the first capacitor DAC circuit 120 and the second capacitor DAC circuit 130 through the selection circuit 140 and compares the electric potential of the first output node with the electric potential of the second output node. The control circuit 160 controls the first capacitor DAC circuit 120 and the second capacitor DAC circuit 130 in accordance with a result of the comparison acquired by the comparison circuit 150. The first capacitor DAC circuit 120 performs a sampling operation (first operation) in parallel with an AD conversion operation (second operation) by the second capacitor DAC circuit 130. The first capacitor DAC circuit 120 performs an AD conversion operation in parallel with a sampling operation by the second capacitor DAC circuit 130. In a sampling operation, electric charge corresponding to an input signal for the first capacitor DAC circuit 120 or the second capacitor DAC circuit 130 is sampled in each first capacitor included in the plurality of first capacitors or each second capacitor included in the plurality of second capacitors. In an AD conversion operation, AD conversions are sequentially performed on the basis of the electric charge sampled in each first capacitor included in the plurality of first capacitors or each second capacitor included in the plurality of second capacitors in accordance with the sampling operation. The first capacitor DAC circuit 120 and the second capacitor DAC circuit 130 alternately perform a sampling operation and an AD conversion operation. The selection circuit 140 selects a capacitor DAC circuit to perform an AD conversion operation out of the first capacitor DAC circuit 120 and the second capacitor DAC circuit 130.

A detailed configuration of the AD converter 100 will be described. As shown in FIG. 4, the AD converter 100 includes a sampling circuit 110, a first capacitor DAC circuit 120, a second capacitor DAC circuit 130, a selection circuit 140, a comparison circuit 150, and a control circuit 160.

The sampling circuit 110 tracks and holds one pair of an analog signal VAP and an analog signal VAN constituting a differential signal VA. In addition, the sampling circuit 110 samples the analog signal VAP and the analog signal VAN for the first capacitor DAC circuit 120 or the second capacitor DAC circuit 130, thereby taking the analog signal VAP and the analog signal VAN into the AD converter 100. The operation of the sampling circuit 110 is controlled on the basis of a sampling signal SH1 and a sampling signal SH2. A differential signal VA is based on video signals VSIG output from a plurality of column circuits COL.

The first capacitor DAC circuit 120 and the second capacitor DAC circuit 130 hold the analog signal VAP and the analog signal VAN sampled by the sampling circuit 110. The first capacitor DAC circuit 120 and the second capacitor DAC circuit 130 generate a reference signal based on a digital signal generated by the control circuit 160. The first capacitor DAC circuit 120 and the second capacitor DAC circuit 130 subtract the reference signal from the analog signal VAP and the analog signal VAN sampled by the sampling circuit 110. Accordingly, each of the first capacitor DAC circuit 120 and the second capacitor DAC circuit 130 acquires an accumulated residual between the differential signal VA and an 8-bit digital signal. Each of the first capacitor DAC circuit 120 and the second capacitor DAC circuit 130 outputs subtraction results acquired by subtracting the reference signal from the analog signal VAP and the analog signal VAN to the comparison circuit 150 through the selection circuit 140 as an analog signal VCP and an analog signal VCN. The analog signal VCP and the analog signal VCN are signals in which the accumulated residuals are reflected.

The selection circuit 140 selects one of the first capacitor DAC circuit 120 and the second capacitor DAC circuit 130. The selection circuit 140 outputs the analog signal VCP and the analog signal VCN output from the selected capacitor DAC circuit to the comparison circuit 150. The operation of the selection circuit 140 is controlled on the basis of a clock signal CLK1 and a clock signal CLK2.

The comparison circuit 150 includes a first input terminal (non-inverted input terminal), a second input terminal (inverted input terminal), a first output terminal (non-inverted output terminal), and a second output terminal (inverted output terminal). The first input terminal and the second input terminal of the comparison circuit 150 are connected to the selection circuit 140. The first input terminal and the second input terminal of the comparison circuit 150 are connected to a capacitor DAC circuit selected by the selection circuit 140 through the selection circuit 140. An analog signal VCP and an analog signal VCN output from the capacitor DAC circuit selected by the selection circuit 140 are input to the comparison circuit 150. The analog signal VCP is input to the first input terminal of the comparison circuit 150, and the analog signal VCN is input to the second input terminal of the comparison circuit 150. The comparison circuit 150 compares the electric potential of the analog signal VCP with the electric potential of the analog signal VCN. The comparison circuit 150 outputs a digital signal VOP based on a result of the comparison from the first output terminal and outputs a digital signal VON based on the result of the comparison from the second output terminal.

More specifically, in a case in which the signal level of the analog signal VCP is higher than the signal level of the analog signal VCN, the comparison circuit 150 outputs a signal of a high level ("H") as the digital signal VOP and outputs a signal of a low level ("L") as the digital signal VON. On the other hand, in a case in which the signal level of the analog signal VCP is lower than the signal level of the analog signal VCN, the comparison circuit 150 outputs a signal of the low level as the digital signal VOP and outputs a signal of the high level as the digital signal VON. The operation of the comparison circuit 150 is controlled on the basis of an internal clock signal BIT_CLK and an inverted internal clock signal BIT_CLKb generated by the control circuit 160.

The control circuit 160 includes a first input terminal, a second input terminal, and an output terminal. The first input terminal of the control circuit 160 is connected to the first output terminal of the comparison circuit 150. The second input terminal of the control circuit 160 is connected to the second output terminal of the comparison circuit 150. The digital signal VOP is input to the first input terminal of the control circuit 160, and the digital signal VON is input to the second input terminal of the control circuit 160. The control circuit 160 generates digital signals D0 to D7 as a result of AD conversions based on the digital signal VOP and the digital signal VON supplied from the comparison circuit 150. The control circuit 160 outputs the digital signals D0 to D7 from the output terminal. The digital signals D0 to D7 are output to a circuit of a downstream stage of the AD converter 100 as the result of AD conversions. Here, the AD converter 100 is an AD converter having an 8-bit output but is not limited to this example. The number of output bits of the AD converter 100 may be arbitrarily set.

The control circuit 160 functions as a successive approximation register (SAR) logic circuit. The control circuit 160 sequentially determines values of bits of digital signals DP10 to DP17 and DP20 to DP27 and digital signals DN10 to DN17 and DN20 to DN27 corresponding to the digital signal VOP and the digital signal VON representing results of comparisons acquired by the comparison circuit 150 in accordance with a binary search algorithm. The control circuit 160 supplies the digital signals DP10 to DP17 and DP20 to DP27 and the digital signals DN10 to DN17 and DN20 to DN27 corresponding to the digital signal VOP and the digital signal VON to the first capacitor DAC circuit 120 and the second capacitor DAC circuit 130. The control circuit 160 outputs the digital signals DP10 to DP17 and DP20 to DP27 as digital signals D0 to D7 representing results of AD conversions. The control circuit 160 generates an internal clock signal BIT_CLK and an inverted internal clock signal BIT_CLKb used for controlling the comparison circuit 150. The control circuit 160 supplies the internal clock signal BIT_CLK and the inverted internal clock signal BIT_CLKb that have been generated to the comparison circuit 150. The operation of the control circuit 160 is controlled on the basis of the clock signal CLK1 and the clock signal CLK2. The control circuit 160 generates an internal clock signal BIT_CLK and an inverted internal clock signal BIT_CLKb in a period in which the clock signal CLK1 or the clock signal CLK2 is at the high level.

The first capacitor DAC circuit 120 includes a capacitor circuit 121 and a driving circuit 122. The capacitor circuit 121 subtracts the reference signal from the analog signal VAP and the analog signal VAN by using electric charge redistribution among a plurality of capacitors. As a result, the capacitor circuit 121 acquires an analog signal VCP and an analog signal VCN representing accumulated residuals. The driving circuit 122 generates the reference signal on the basis of the digital signals DP10 to DP17 and the digital signals DN10 to DN17 input from the control circuit 160, thereby driving the capacitor circuit 121.

The second capacitor DAC circuit 130 includes a capacitor circuit 131 and a driving circuit 132. The capacitor circuit 131 subtracts the reference signal from the analog signal VAP and the analog signal VAN by using electric charge redistribution among a plurality of capacitors. As a result, the second capacitor DAC circuit 130 acquires an analog signal VCP and an analog signal VCN representing accumulated residuals. The driving circuit 132 generates the reference signal on the basis of the digital signals DP20 to DP27 and the digital signals DN20 to DN27 input from the control circuit 160, thereby driving the capacitor circuit 131.

The AD converter 100 sequentially acquires results of AD conversions one bit at a time from an MSB (D7) to an LSB (D0) of the digital signals D0 to D7. In the AD conversion, the comparison circuit 150 compares the voltage of the analog signal VCP and the voltage of the analog signal VCN, in which the accumulated residual is reflected, with each other every time the subtraction described above is performed by the capacitor circuit 121 of the first capacitor DAC circuit 120 or the capacitor circuit 131 of the second capacitor DAC circuit 130.

Figure 5:
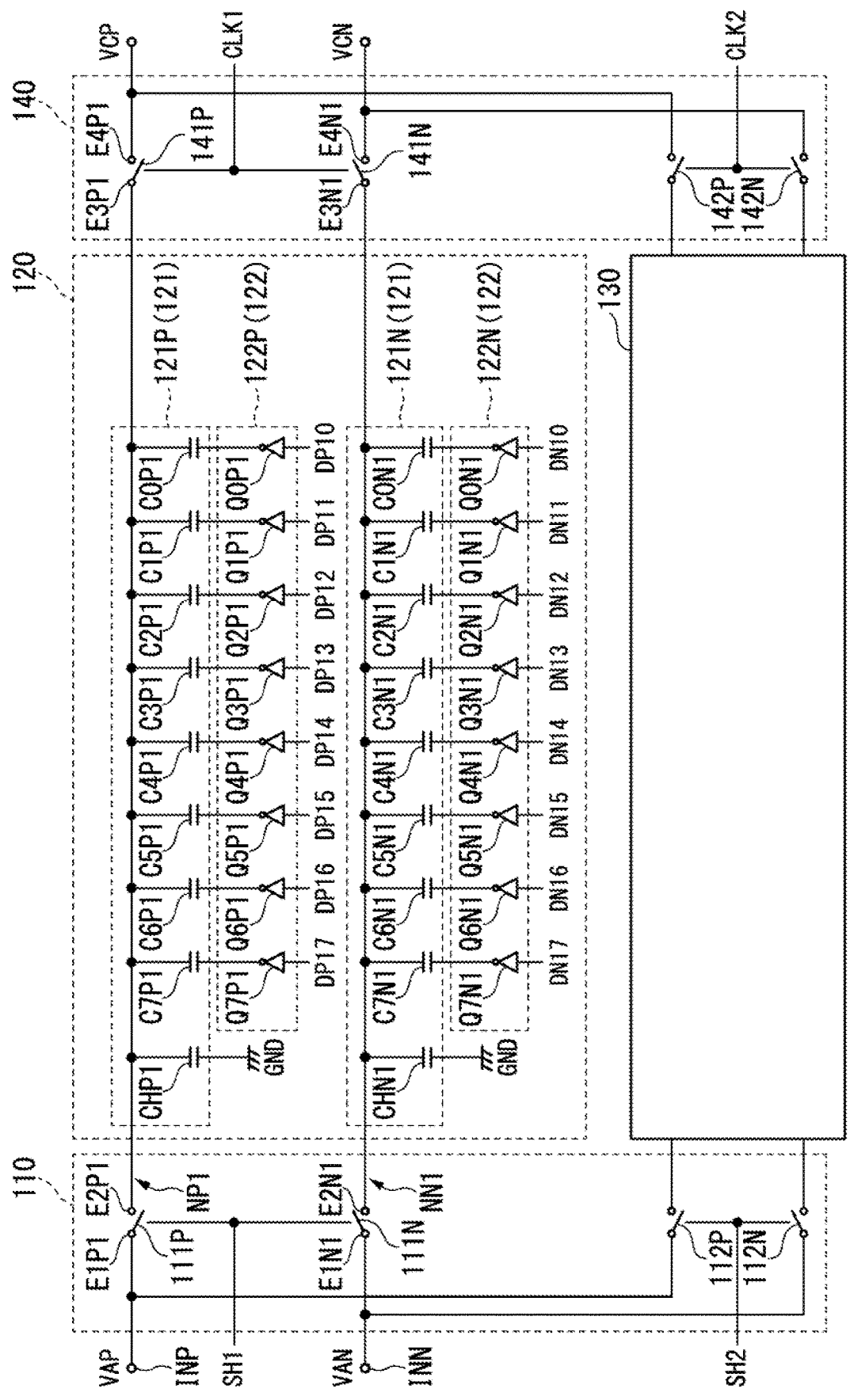
FIG. 5 is a circuit diagram showing the configurations of a sampling circuit, a first capacitor DAC circuit, a second capacitor DAC circuit, and a selection circuit according to the first embodiment of the present invention.
Figure 6:
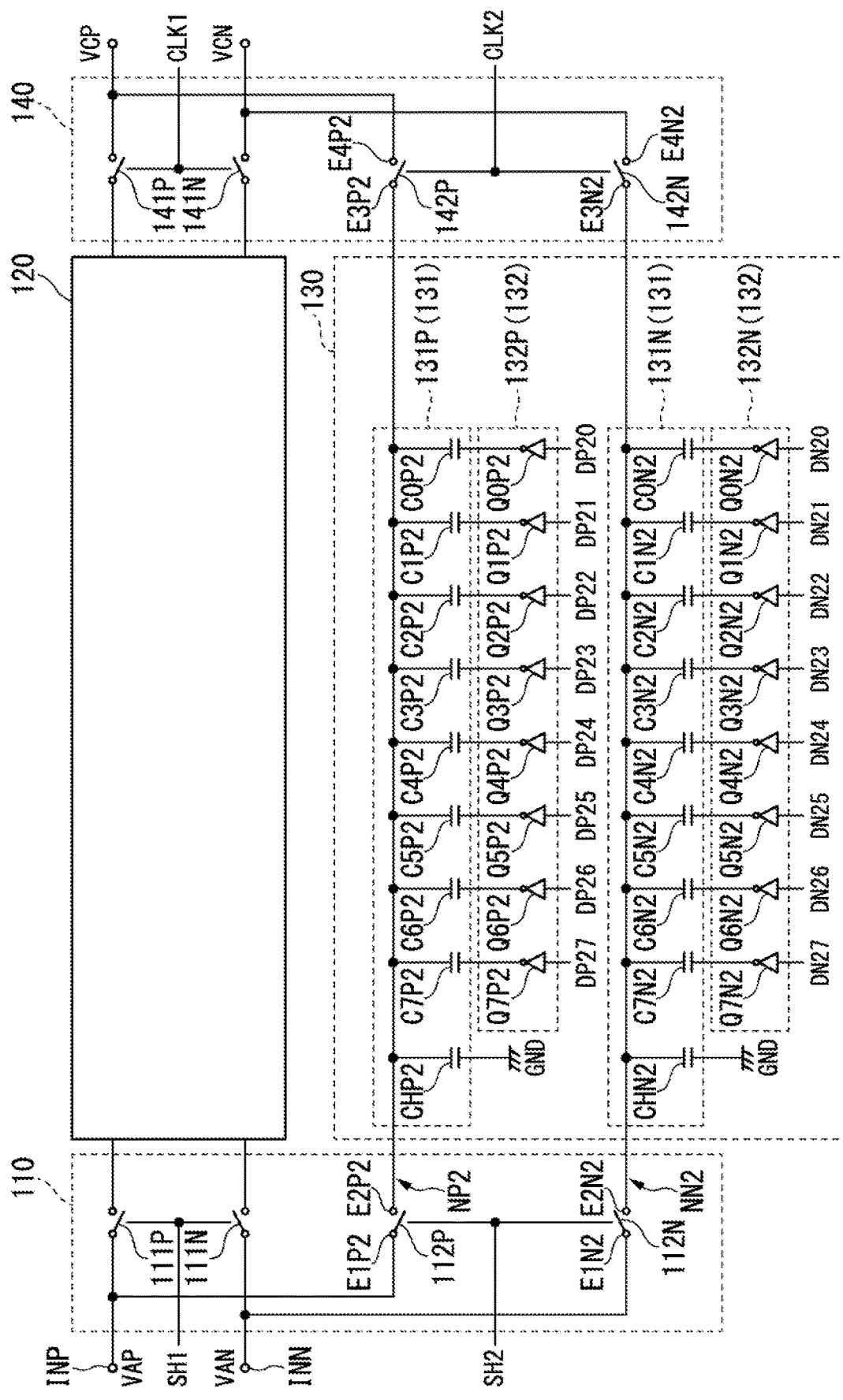
FIG. 6 is a circuit diagram showing the configurations of a sampling circuit, a first capacitor DAC circuit, a second capacitor DAC circuit, and a selection circuit according to the first embodiment of the present invention.

FIGS. 5 and 6 show the configurations of the sampling circuit 110, the first capacitor DAC circuit 120, the second capacitor DAC circuit 130, and the selection circuit 140. Due to restrictions on space, the internal configuration of the second capacitor DAC circuit 130 is not shown in FIG. 5. In addition, due to restrictions on space, the internal configuration of the first capacitor DAC circuit 120 is not shown in FIG. 6.

The sampling circuit 110 includes switches 111P, 111N, 112P, and 112N. Each of the switches includes a first terminal and a second terminal. The state of each of the switches is switched between on and off.

The first terminal E1P1 of the switch 111P is connected to a non-inverted input terminal INP to which the analog signal VAP is input. The second terminal E2P1 of the switch 111P is connected to a node NP1 of the first capacitor DAC circuit 120. When the switch 111P is on, the first terminal E1P1 and the second terminal E2P1 of the switch 111P are connected. At this time, the analog signal VAP is input to the node NP1 of the first capacitor DAC circuit 120. When the switch 111P is off, a high impedance state is formed between the first terminal E1P1 and the second terminal E2P1 of the switch 111P. The switch 111P samples the analog signal VAP. When the switch 111P is switched from on to off, the analog signal VAP is held in a capacitor unit 121P to be described later. On and off of the switch 111P are switched between on the basis of a sampling signal SH1.

The first terminal E1P2 of the switch 112P is connected to the non-inverted input terminal INP to which the analog signal VAP is input. The second terminal E2P2 of the switch 112P is connected to the node NP2 of the second capacitor DAC circuit 130. When the switch 112P is on, the first terminal E1P2 and the second terminal E2P2 of the switch 112P are connected. At this time, the analog signal VAP is input to the node NP2 of the second capacitor DAC circuit 130. On the other hand, when the switch 112P is off a high impedance state is formed between the first terminal E1P2 and the second terminal E2P2 of the switch 112P. The switch 112P samples the analog signal VAP. When the switch 112P is switched from on to off, the analog signal VAP is held in the capacitor unit 131P to be described later. On and off of the switch 112P are switched between on the basis of the sampling signal SH2.

The first terminal E1N1 of the switch 111N is connected to the inverted input terminal INN to which the analog signal VAN is input. The second terminal E2N1 of the switch 111N is connected to a node NN1 of the first capacitor DAC circuit 120. When the switch 111N is on, the first terminal E1N1 and the second terminal E2N1 of the switch 111N are connected. At this time, the analog signal VAN is input to the node NN1 of the first capacitor DAC circuit 120. When the switch 111N is off a high impedance state is formed between the first terminal E1N1 and the second terminal E2N1 of the switch 111N. The switch 111N samples the analog signal VAN. When the switch 111N is switched from on to off the analog signal VAN is held in a capacitor unit 121N to be described later. On and off of the switch 111N are switched between on the basis of the sampling signal SH1.

The first terminal E1N2 of the switch 112N is connected to the inverted input terminal INN to which the analog signal VAN is input. The second terminal E2N2 of the switch 112N is connected to a node NN2 of the second capacitor DAC circuit 130. When the switch 112N is on, the first terminal E1N2 and the second terminal E2N2 of the switch 112N are connected. At this time, the analog signal VAN is input to the node NN2 of the second capacitor DAC circuit 130. On the other hand, when the switch 112N is off, a high impedance state is formed between the first terminal E1N2 and the second terminal E2N2 of the switch 112N. The switch 112N samples the analog signal VAN. When the switch 112N is switched from on to off, the analog signal VAN is held in a capacitor unit 131N to be described later. On and off of the switch 112N are switched between on the basis of the sampling signal SH2.

The capacitor circuit 121 constituting the first capacitor DAC circuit 120 includes a capacitor unit 121P and a capacitor unit 121N. The capacitor unit 121P includes a damping capacitor CHP1 and binary capacitors C0P1 to C7P1 (first capacitors). Each of the capacitors includes a first terminal and a second terminal. The first terminal of the damping capacitor CHP1 is connected to the node NP1. The second terminal of the damping capacitor CHP1 is connected to the ground GND. The first terminals of the binary capacitors C0P1 to C7P1 are connected to the node NP1. The second terminals of the binary capacitors C0P1 to C7P1 are connected to a driving unit 122P constituting the driving circuit 122. The damping capacitor CHP1 and the binary capacitors C0P1 to C7P1 hold the analog signals VAP sampled by the switch 111P of the sampling circuit 110.

The binary capacitors C0P1 to C7P1 are disposed in correspondence with the digital signals DP10 to DP17 generated by the control circuit 160. The capacitance values of the binary capacitors C0P1 to C7P1 are different from each other. For example, the capacitance value of a binary capacitor C(n+1)P1 corresponding to a digital signal DP(n+11) is twice the capacitance value of a binary capacitor CnP1 corresponding to a digital signal DP1n. Here, n is an integer of "0" to "6." The capacitance values of the binary capacitors C0P1 to C7P1 are weighted with binary numbers corresponding to the bits of the digital signals DP10 to DP17.

The capacitor unit 121N includes a damping capacitor CHN1 and binary capacitors C0N1 to C7N1 (first capacitors). Each of the capacitors includes a first terminal and a second terminal. The first terminal of the damping capacitor CHN1 is connected to the node NN1. The second terminal of the damping capacitor CHN1 is connected to the ground GND. The first terminals of the binary capacitors C0N1 to C7N1 are connected to the node NN1. The second terminals of the binary capacitors C0N1 to C7N1 are connected to a driving unit 122N constituting the driving circuit 122. The damping capacitor CHN1 and the binary capacitors C0N1 to C7N1 hold the analog signals VAN sampled by the switch 111N of the sampling circuit 110.

The binary capacitors C0N1 to C7N1 are disposed in correspondence with the digital signals DN10 to DN17 generated by the control circuit 160. The capacitance values of the binary capacitors C0N1 to C7N1 are different from each other. Similar to the binary capacitors C0P1 to C7P1, the capacitance values of the binary capacitors C0N1 to C7N1 are weighted with binary numbers corresponding to the bits of the digital signals DN10 to DN17.

The capacitor circuit 131 constituting the second capacitor DAC circuit 130 includes a capacitor unit 131P and a capacitor unit 131N. The capacitor unit 131P includes a damping capacitor CHP2 and binary capacitors C0P2 to C7P2 (second capacitors). Each of the capacitors includes a first terminal and a second terminal. The first terminal of the damping capacitor CHP2 is connected to the node NP2. The second terminal of the damping capacitor CHP2 is connected to the ground GND. The first terminals of the binary capacitors C0P2 to C7P2 are connected to the node NP2. The second terminals of the binary capacitors C0P2 to C7P2 are connected to a driving unit 132P constituting the driving circuit 132. The damping capacitor CHP2 and the binary capacitors C0P2 to C7P2 hold the analog signal VAP sampled by the switch 112P of the sampling circuit 110.

The binary capacitors C0P2 to C7P2 are disposed in correspondence with the digital signals DP20 to DP27 generated by the control circuit 160. The capacitance values of the binary capacitors C0P2 to C7P2 are different from each other. Similar to the binary capacitors C0P1 to C7P1, the capacitance values of the binary capacitors C0P2 to C7P2 are weighted with binary numbers corresponding to the bits of the digital signals DP20 to DP27.

The capacitor unit 131N includes a damping capacitor CHN2 and binary capacitors C0N2 to C7N2 (second capacitors). Each of the capacitors includes a first terminal and a second terminal. The first terminal of the damping capacitor CHN2 is connected to the node NN2. The second terminal of the damping capacitor CHN2 is connected to the ground GND. The first terminals of the binary capacitors C0N2 to C7N2 are connected to the node NN2. The second terminals of the binary capacitors C0N2 to C7N2 are connected to a driving unit 132N constituting the driving circuit 132. The damping capacitor CHN2 and the binary capacitors C0N2 to C7N2 hold the analog signal VAN sampled by the switch 112N of the sampling circuit 110.

The binary capacitors C0N2 to C7N2 are disposed in correspondence with the digital signals DN20 to DN27 generated by the control circuit 160. The capacitance values of the binary capacitors C0N2 to C7N2 are different from each other. Similar to the binary capacitors C0P1 to C7P1, the capacitance values of the binary capacitors C0N2 to C7N2 are weighted with binary numbers corresponding to the bits of the digital signals DN20 to DN27.

The driving circuit 122 constituting the first capacitor DAC circuit 120 includes a driving unit 122P and a driving unit 122N. The driving unit 122P includes inverters Q0P1 to Q7P1. A power source voltage is supplied to the inverters Q0P1 to Q7P1. For this reason, the amplitudes of reference signals output from the inverters Q0P1 to Q7P1 are the same as that of the power source voltage. The inverters Q0P1 to Q7P1 are disposed in correspondence with the digital signals DP10 to DP17 generated by the control circuit 160. Each of the inverters Q0P1 to Q7P1 includes an input terminal and an output terminal. The bits of the digital signals DP10 to DP17 are input from the control circuit 160 to the input terminals of the inverters Q0P1 to Q7P1. The output terminals of the inverters Q0P1 to Q7P1 are connected to the second terminals of the binary capacitors C0P1 to C7P1.

The inverters Q0P1 to Q7P1 generate reference signals by inverting the digital signals DP10 to DP17 output from the control circuit 160. The plurality of binary capacitors C0P1 to C7P1 included in the capacitor unit 121P extract electric charge based on the reference signals from electric charge based on the analog signal VAP held in the damping capacitor CHP1 through electric charge redistribution. Accordingly, the binary capacitors C0P1 to C7P1 subtract the reference signals from the analog signal VAP. The capacitor unit 121P outputs analog signals VCP that are results of the subtraction to the node NP1.

The driving unit 122N includes inverters Q0N1 to Q7N1. A power source voltage is supplied to the inverters Q0N1 to Q7N1. For this reason, the amplitudes of the reference signals output from the inverters Q0N1 to Q7N1 are the same as that of the power source voltage. The inverters Q0N1 to Q7N1 are disposed in correspondence with the digital signals DN10 to DN17 generated by the control circuit 160. Each of the inverters Q0N1 to Q7N1 includes an input terminal and an output terminal. The bits of the digital signals DN10 to DN17 are input from the control circuit 160 to the input terminals of the inverters Q0N1 to Q7N1. The output terminals of the inverters Q0N1 to Q7N1 are connected to the second terminals of the binary capacitors C0N1 to C7N1.

The inverters Q0N1 to Q7N1 invert the digital signals DN10 to DN17 output from the control circuit 160, thereby generating reference signals. The plurality of binary capacitors C0N1 to C7N1 included in the capacitor unit 121N extract electric charge based on the reference signals from the electric charge based on the analog signal VAN held in the damping capacitor CHN1 through electric charge redistribution. In this way, the binary capacitors C0N1 to C7N1 subtract the reference signals from the analog signal VAN. The capacitor unit 121N outputs an analog signal VCN that is a result of the subtraction to the node NN1.

The driving circuit 132 constituting the second capacitor DAC circuit 130 includes a driving unit 132P and a driving unit 132N. The driving unit 132P includes inverters Q0P2 to Q7P2. A power source voltage is supplied to the inverters Q0P2 to Q7P2. For this reason, the amplitudes of reference signals output from the inverters Q0P2 to Q7P2 are the same as that of the power source voltage. The inverters Q0P2 to Q7P2 are disposed in correspondence with the digital signals DP20 to DP27 generated by the control circuit 160. Each of the inverters Q0P2 to Q7P2 includes an input terminal and an output terminal. The bits of the digital signals DP20 to DP27 are input from the control circuit 160 to the input terminals of the inverters Q0P2 to Q7P2. The output terminals of the inverters Q0P2 to Q7P2 are connected to the second terminals of the binary capacitors C0P2 to C7P2.

The inverters Q0P2 to Q7P2 generate reference signals by inverting the digital signals DP20 to DP27 output from the control circuit 160. The plurality of binary capacitors C0P2 to C7P2 included in the capacitor unit 131P extract electric charge based on the reference signals from electric charge based on the analog signal VAP held in the damping capacitor CHP2 through electric charge redistribution. Accordingly, the binary capacitors C0P2 to C7P2 subtract the reference signals from the analog signal VAP. The capacitor unit 121P outputs analog signals VCP that are results of the subtraction to the node NP2.

The driving unit 132N includes inverters Q0N2 to Q7N2. A power source voltage is supplied to the inverters Q0N2 to Q7N2. For this reason, the amplitudes of the reference signals output from the inverters Q0N2 to Q7N2 are the same as that of the power source voltage. The inverters Q0N2 to Q7N2 are disposed in correspondence with the digital signals DN20 to DN27 generated by the control circuit 160. Each of the inverters Q0N2 to Q7N2 includes an input terminal and an output terminal. The bits of the digital signals DN20 to DN27 are input from the control circuit 160 to the input terminals of the inverters Q0N2 to Q7N2. The output terminals of the inverters Q0N2 to Q7N2 are connected to the second terminals of the binary capacitors C0N2 to C7N2.

The inverters Q0N2 to Q7N2 invert the digital signals DN20 to DN27 output from the control circuit 160, thereby generating reference signals. The plurality of binary capacitors C0N2 to C7N2 included in the capacitor unit 131N extract electric charge based on the reference signals from the electric charge based on the analog signal VAN held in the damping capacitor CHN2 through electric charge redistribution. In this way, the binary capacitors C0N2 to C7N2 subtract the reference signals from the analog signal VAN. The capacitor unit 131N outputs an analog signal VCN that is a result of the subtraction to the node NN2.

The selection circuit 140 includes a switch 141P, a switch 141N, a switch 142P, and a switch 142N. Each of the switches includes a first terminal and a second terminal. The state of each of the switches is switched between on and off.

The first terminal E3P1 of the switch 141P is connected to the node NP1 of the first capacitor DAC circuit 120. The second terminal E4P1 of the switch 141P is connected to the first input terminal of the comparison circuit 150. When the switch 141P is on, the first terminal E3P1 and the second terminal E4P1 of the switch 141P are connected. At this time, an analog signal VCP generated by the capacitor unit 121P is input to the first input terminal of the comparison circuit 150. On the other hand, when the switch 141P is off, a high impedance state is formed between the first terminal E3P1 and the second terminal E4P1 of the switch 141P. The switch 141P selects the first capacitor DAC circuit 120 and selects the capacitor unit 121P. On and off of the switch 141P are switched between on the basis of the clock signal CLK1.

The first terminal E3N1 of the switch 141N is connected to the node NN1 of the first capacitor DAC circuit 120. The second terminal E4N1 of the switch 141N is connected to the second input terminal of the comparison circuit 150. When the switch 141N is on, the first terminal E3N1 and the second terminal E4N1 of the switch 141N are connected. At this time, an analog signal VCN generated by the capacitor unit 121N is input to the second input terminal of the comparison circuit 150. On the other hand, when the switch 141N is off, a high impedance state is formed between the first terminal E3N1 and the second terminal E4N1 of the switch 141N. The switch 141N selects the first capacitor DAC circuit 120 and selects the capacitor unit 121N. On and off of the switch 141N are switched between on the basis of the clock signal CLK1.

The first terminal E3P2 of the switch 142P is connected to the node NP2 of the second capacitor DAC circuit 130. The second terminal E4P2 of the switch 142P is connected to the first input terminal of the comparison circuit 150. When the switch 142P is on, the first terminal E3P2 and the second terminal E4P2 of the switch 142P are connected. At this time, an analog signal VCP generated by the capacitor unit 131P is input to the first input terminal of the comparison circuit 150. On the other hand, when the switch 142P is off, a high impedance state is formed between the first terminal E3P2 and the second terminal E4P2 of the switch 142P. The switch 142P selects the second capacitor DAC circuit 130 and selects the capacitor unit 131P. On and off of the switch 142P are switched between on the basis of the clock signal CLK2.

The first terminal E3N2 of the switch 142N is connected to the node NN2 of the second capacitor DAC circuit 130. The second terminal E4N2 of the switch 142N is connected to the second input terminal of the comparison circuit 150. When the switch 142N is on, the first terminal E3N2 and the second terminal E4N2 of the switch 142N are connected. At this time, an analog signal VCN generated by the capacitor unit 131N is input to the second input terminal of the comparison circuit 150. On the other hand, when the switch 142N is off a high impedance state is formed between the first terminal E3N2 and the second terminal E4N2 of the switch 142N. The switch 142N selects the second capacitor DAC circuit 130 and selects the capacitor unit 131N. On and off of the switch 142N are switched between on the basis of the clock signal CLK2.

The node NP1 is connected to the second terminal E2P1 of the switch 111P, the first terminal of the damping capacitor CHP1, the first terminals of the binary capacitors C0P1 to C7P1, and the first terminal E3P1 of the switch 141P. The node NP1 is positioned at an arbitrary position on a signal line that is electrically connected to these. The node NP1 constitutes the first input node and the first output node of the first capacitor DAC circuit 120. The node NN1 is connected to the second terminal E2N1 of the switch 111N, the first terminal of the damping capacitor CHN1, the first terminals of the binary capacitors C0N1 to C7N1, and the first terminal E3N1 of the switch 141N. The node NN1 is positioned at an arbitrary position on a signal line that is electrically connected to these. The node NN1 constitutes the second input node and the second output node of the first capacitor DAC circuit 120.

The node NP2 is connected to the second terminal E2P2 of the switch 112P, the first terminal of the damping capacitor CHP2, the first terminals of the binary capacitors C0P2 to C7P2, and the first terminal E3P2 of the switch 142P. The node NP2 is positioned at an arbitrary position on a signal line that is electrically connected to these. The node NP2 constitutes the first input node and the first output node of the second capacitor DAC circuit 130. The node NN2 is connected to the second terminal E2N2 of the switch 112N, the first terminal of the damping capacitor CHN2, the first terminals of the binary capacitors C0N2 to C7N2, and the first terminal E3N2 of the switch 142N. The node NN2 is positioned at an arbitrary position on a signal line that is electrically connected to these. The node NN2 constitutes the second input node and the second output node of the second capacitor DAC circuit 130.

A schematic operation of the AD converter 100 will be described. In a sampling operation, an analog signal VAP is applied to the node NP1 of the first capacitor DAC circuit 120 or the node NP2 of the second capacitor DAC circuit 130. In the sampling operation, first electric charge is held in the damping capacitor CHP1 and a plurality of the binary capacitors C0P1 to C7P1. Alternatively, in the sampling operation, second electric charge is held in the damping capacitor CHN1 and a plurality of the binary capacitors C0N1 to C7N1. The first electric charge and the second electric charge are based on a difference between the electric potential of the analog signal VAP and the electric potential of the reference signal. In a sampling operation, an analog signal VAN is applied to the node NN1 of the first capacitor DAC circuit 120 or the node NN2 of the second capacitor DAC circuit 130. In the sampling operation, third electric charge is held in the damping capacitor CHP2 and a plurality of the binary capacitors C0P2 to C7P2. Alternatively, in the sampling operation, fourth electric charge is held in the damping capacitor CHN2 and a plurality of the binary capacitors C0N2 to C7N2. The third electric charge and the fourth electric charge are based on a difference between the electric potential of the analog signal VAN and the electric potential of the reference signal.

In an AD conversion operation by the first capacitor DAC circuit 120, a first electric potential based on the first electric charge is input to the comparison circuit 150, and a second electric potential based on the second electric charge is input to the comparison circuit 150. The comparison circuit 150 compares the first electric potential with the second electric potential. In an AD conversion operation by the second capacitor DAC circuit 130, a third electric potential based on the third electric charge is input to the comparison circuit 150, and a fourth electric potential based on the fourth electric charge is input to the comparison circuit 150. The comparison circuit 150 compares the third electric potential with the fourth electric potential.

The control circuit 160 controls a capacitor DAC circuit performing an AD conversion operation out of the first capacitor DAC circuit 120 and the second capacitor DAC circuit 130 on the basis of a result of the comparison. In other words, the control circuit 160 controls the capacitor DAC circuit selected by the selection circuit 140 on the basis of the result of the comparison. The control circuit 160 outputs control signals (digital signals DP10 to DP17, DP10N to DP17N, DP20 to DP27, and DP20N to DP27N) based on the result of the comparison to the capacitor DAC circuit selected by the selection circuit 140. In the AD conversion operation by the first capacitor DAC circuit 120, reference signals based on the control signals (the digital signals DP10 to DP17, and DP10N to DP17N) are generated, and the first electric charge or the second electric charge change on the basis of the reference signals. In the AD conversion operation by the second capacitor DAC circuit 130, reference signals based on the control signals (the digital signals DP20 to DP27 and DP20N to DP27N) are generated, and the third electric charge or the fourth electric charge changes on the basis of the reference signals.

Figure 7:
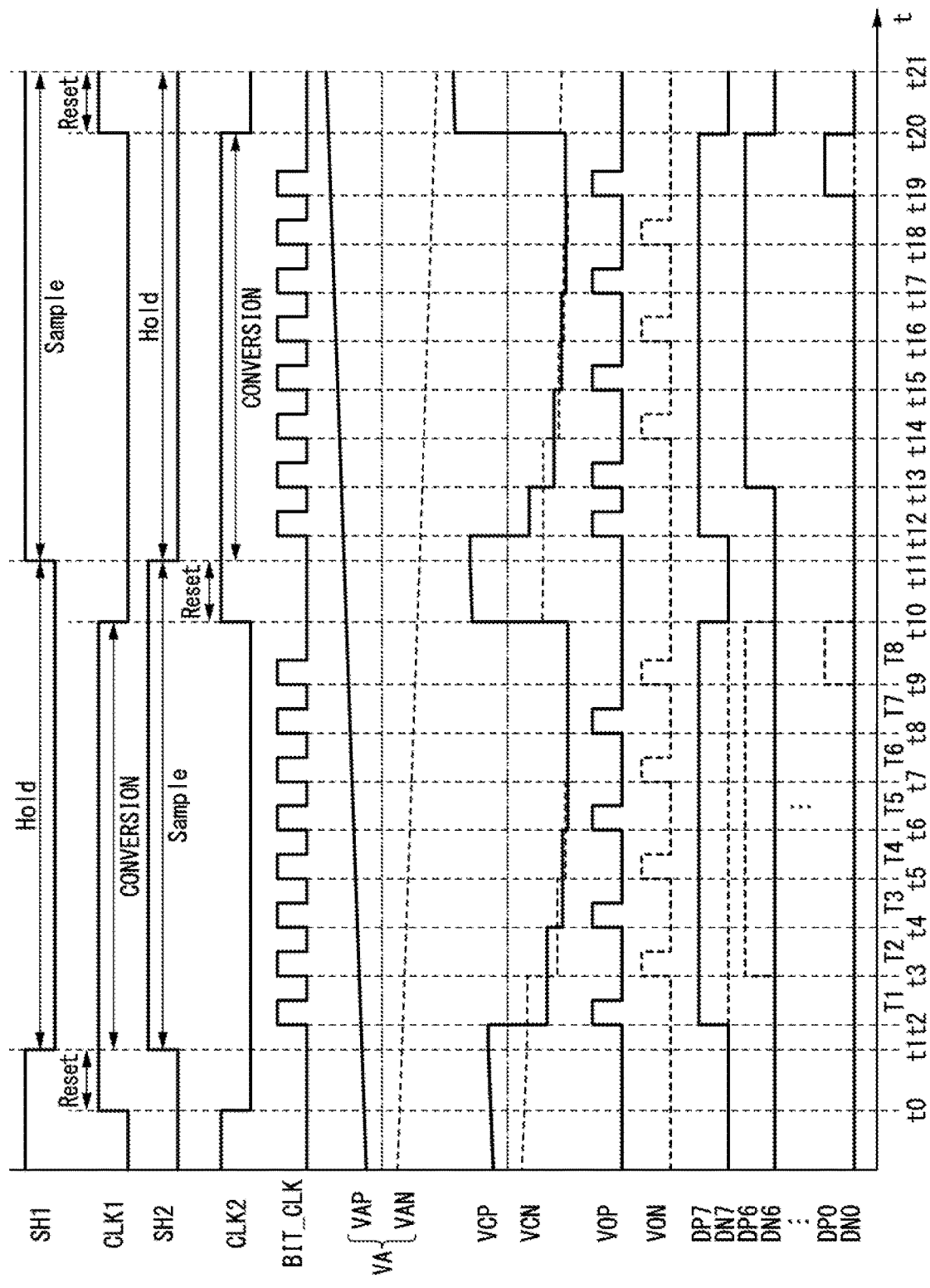
FIG. 7 is a timing diagram showing an operation of an AD converter according to the first embodiment of the present invention.

The operation of the AD converter 100 will be described with reference to FIG. 7. FIG. 7 shows signals relating to the operation of the AD converter 100. In FIG. 7, a sampling signal SH1, a clock signal CLK1, a sampling signal SH2, a clock signal CLK2, and an internal clock signal BIT_CLK are shown. In FIG. 7, an analog signal VAP, an analog signal VAN, an analog signal VCP, an analog signal VCN, a digital signal VOP, and a digital signal VON are shown. In FIG. 7, digital signals DP0 to DP7 corresponding to the digital signal VOP and digital signals DN0 to DN7 corresponding to the digital signal VON are shown. The digital signals DP0 to DP7 show the digital signals DP10 to DP17 or the digital signals DP20 to DP27. The digital signals DN0 to DPN show the digital signals DN10 to DN17 or the digital signals DN20 to DN27. In FIG. 7, the horizontal axis represents time, and the vertical axis represents a signal level.

In a case in which the sampling signal SH1 or the sampling signal SH2 is at the high level, the sampling circuit 110 tracks and samples an analog signal VAP and an analog signal VAN input as a differential signal VA in the first capacitor DAC circuit 120 or the second capacitor DAC circuit 130. At a timing at which the sampling signal SH1 or the sampling signal SH2 changes from the high level to the low level, the sampling circuit 110 holds the analog signal VAP and the analog signal VAN.

Hereinafter, a period in which the sampling signal SH1 is at the high level will be referred to as a first sampling period, and a period in which the sampling signal SH2 is at the high level will be referred to as a second sampling period. In addition, hereinafter, a period in which the sampling signal SH1 is at the low level will be referred to as a first holding period, and a period in which the sampling signal SH2 is at the low level will be referred to as a second holding period.

After an AD conversion by the second capacitor DAC circuit 130 is completed in the first sampling period, in a period in which the clock signal CLK1 is at the high level, the analog signal VAP and the analog signal VAN sampled in the first capacitor DAC circuit 120 are output to the comparison circuit 150 through the selection circuit 140. Accordingly, the comparison circuit 150 to which the analog signal VCP and the analog signal VCN generated by the AD conversion operation by the second capacitor DAC circuit 130 are input is reset. In this reset operation, the analog signal VAP and the analog signal VAN are applied to the comparison circuit 150 as reference voltages.

After an AD conversion by the first capacitor DAC circuit 120 is completed in the second sampling period, in a period in which the clock signal CLK2 is at the high level, the analog signal VAP and the analog signal VAN sampled in the second capacitor DAC circuit 130 are output to the comparison circuit 150 through the selection circuit 140. Accordingly, the comparison circuit 150 to which the analog signal VCP and the analog signal VCN generated by the AD conversion operation by the first capacitor DAC circuit 120 are input is reset. In this reset operation, the analog signal VAP and the analog signal VAN are applied to the comparison circuit 150 as reference voltages.

As described above, between a sampling operation and an AD conversion operation, a reset operation of applying the reference voltages to the first input terminal of the comparison circuit 150 and the second input terminal of the comparison circuit 150 is performed.

The AD converter 100 performs an AD conversion of the analog signal VAP and the analog signal VAN sampled in the sampling period by the sampling circuit 110 in the holding period Schematically, the AD converter 100 sequentially determines values of the bits of the digital signals D0 to D7 from an MSB (D7) to an LSB (D0) of the digital signals D0 to D7 in accordance with timings of the internal clock signal BIT_CLK and the inverted internal clock signal BIT_CLKb input from the control circuit 160 in the holding period. Accordingly, the AD converter 100 performs an AD conversion of the analog signal VAP and the analog signal VAN held by the sampling circuit 110 and generates digital signals D0 to D7.

The AD conversion by the AD converter 100 will be described in detail. In a first sampling period before a time t0 shown in FIG. 7, the sampling signal SH1 is at the high level. For this reason, the switch 110P and the switch 110N of the sampling circuit 110 are on. In this case, an analog signal VAP and an analog signal VAN are sampled (tracked) by the sampling circuit 110 and are output to the first capacitor DAC circuit 120. Electric charge corresponding to the electric potentials of the analog signal VAP and the analog signal VAN output from the sampling circuit 110 is sampled in the damping capacitors CHP1 and CHN1 and the binary capacitors C0P1 to C7P1 and C0N1 to C7N1 of the first capacitor DAC circuit 120.

When the first sampling period starts, bits of the digital signals DP0 to DP7 and the digital signals DN0 to DN7 output from the control circuit 160 are set (initialized) as "0." At the time t0, the clock signal CLK1 changes from the low level to the high level, whereby a reset period starts. Accordingly, the switch 141P and the switch 141N of the selection circuit 140 are turned on. As a result, the analog signal VAP is applied to the first input terminal of the comparison circuit 150, and the analog signal VAN is input to the second input terminal of the comparison circuit 150.

In other words, the comparison circuit 150 is in a reset state. At the same time, the clock signal CLK2 changes from the high level to the low level.

At a time t1, the sampling signal SH1 changes from the high level to the low level, and thus the first sampling period ends, and a first holding period starts. Accordingly, the switch 110P and the switch 110N of the sampling circuit 110 are tinned off. For this reason, the analog signal VAP immediately before a change in the sampling signal SH1 from the high level to the low level is held in the damping capacitor CHP1 and the binary capacitors C0P1 to C7P1 of the capacitor circuit 121. The analog signal VAN immediately before a change in the sampling signal SH1 from the high level to the low level is held in the damping capacitor CHN1 and the binary capacitors C0N1 to C7N1 of the capacitor circuit 121. The analog signal VAP and the analog signal VAN held as described above are output from the first capacitor DAC circuit 120 to the comparison circuit 150 through the selection circuit 140 as an analog signal VCP and an analog signal VCN. An AD conversion in the first holding period is performed on the basis of the electric charge sampled in the first capacitor DAC circuit 120.

The comparison circuit 150 sequentially compares the analog signal VCP and the analog signal VCN output from the first capacitor DAC circuit 120 with each other in accordance with control by the control circuit 160. An operation in a period T1 from a time t2 corresponding to a first cycle of the internal clock signal BIT_CLK to a time t3 after the time t0 will be described.

At the time t1, the analog signal VAP and the analog signal VAN are held in the capacitor circuit 121, and the analog signal VCP and the analog signal VCN are output from the first capacitor DAC circuit 120. In this state, at the time t2, the internal clock signal BIT_CLK changes from the low level to the high level. Accordingly, the comparison circuit 150 becomes active, and the comparison circuit 150 starts to compare the analog signal VCP with the analog signal VCN.

In the example shown in FIG. 7, the signal level of the analog signal VCP at the time t2 is higher than the signal level of the analog signal VCN (VCP>VCN). For this reason, the comparison circuit 150 outputs a digital signal VOP having a high level and a digital signal VON having a low level as a result of the comparison. The control circuit 160 outputs a digital signal DP17 having the high level and a digital signal DN17 having the low level on the basis of the result of the comparison performed by the comparison circuit 150. Accordingly, a value of the MSB (D7) of the digital signals D0 to D7 that are the result of the AD conversion is determined. The digital signal DP17 is output as the digital signal D7.

When the digital signal DP17 changes from the low level to the high level, the reference signal supplied from the inverter Q7P1 of the driving unit 122P to which the digital signal DP17 is input changes from the high level to the low level. For this reason, a voltage between the first terminal and the second terminal of the binary capacitor C7P1 to which the reference signal supplied from the inverter Q7P1 is applied changes. In accordance with the amount of change in the voltage between the terminals of the binary capacitor C7P1, electric charge accumulated in the binary capacitor C7P1 is extracted, whereby electric charge redistribution is performed. In accordance with the electric charge redistribution, the electric potential of the node NP1 decreases to an electric potential corresponding to the electric charge extracted from the binary capacitor C7P1. For this reason, the signal level of the analog signal VCP given in accordance with the electric potential of the node NP1 decreases.

Since the digital signal DN17 is maintained at the low level, a reference signal supplied from the inverter Q7N1 of the driving unit 122N to which the digital signal DN17 is input is maintained at the high level. For this reason, the electric charge of the binary capacitor C7N1 to which the reference signal supplied from the inverter Q7N1 is applied does not move. In other words, the electric potential of the node NN1 does not change. For this reason, the signal level of the analog signal VCN given in accordance with the electric potential of the node NN1 does not change.

In the period T1, the internal clock signal BIT_CLK becomes the low level, and the inverted internal clock signal BIT_CLKb becomes the high level. Accordingly, the comparison circuit 150 becomes inactive. In this case, the comparison circuit 150 outputs the digital signal VOP and the digital signal VON having the low level.

An operation of a period T2 of the time t3 to a time t4 corresponding to a second cycle of the internal block signal BIT_CLK will be described.

As described above, the analog signal VAP and the analog signal VAN are held in the capacitor circuit 121, and the analog signal VCP and the analog signal VCN are output from the first capacitor DAC circuit 120. In this state, at a time t3, the internal clock signal BIT_CLK changes from the low level to the high level, and the inverted internal clock signal BIT_CLKb changes from the high level to the low level. Accordingly, the comparison circuit 150 becomes active, and the comparison circuit 150 starts to compare the analog signal VCP with the analog signal VCN.

In the example shown in FIG. 7, the signal level of the analog signal VCP at the time t3 is lower than the signal level of the analog signal VCN (VCP<VCN). For this reason, the comparison circuit 150 outputs the digital signal VOP having the low level and the digital signal VON having the high level as a result of the comparison. The control circuit 160 outputs a digital signal DP16 having the low level and a digital signal DN16 having the high level on the basis of the result of the comparison performed by the comparison circuit 150. Accordingly, a value of a second bit (D6) from the MSB of the digital signals D0 to D7 that are the result of the AD conversion is determined. The digital signal DP16 is output as the digital signal D6.

When the digital signal DN16 changes from the low level to the high level, the reference signal supplied from the inverter Q6N1 of the driving unit 122N to which the digital signal DN16 is input changes from the high level to the low level. For this reason, a voltage between the first terminal and the second terminal of the binary capacitor C6N1 to which the reference signal supplied from the inverter Q6N1 is applied changes. In accordance with the amount of change in the voltage between the terminals of the binary capacitor C6N1, electric charge accumulated in the binary capacitor C6N1 is extracted, whereby electric charge redistribution is performed. In accordance with the electric charge redistribution, the electric potential of the node NN1 decreases to an electric potential corresponding to the electric charge extracted from the binary capacitor C6N1. For this reason, the signal level of the analog signal VCN given in accordance with the electric potential of the node NN1 decreases.

Since the digital signal DP16 is maintained at the low level, a reference signal supplied from the inverter Q6P1 of the driving unit 122P to which the digital signal DP16 is input is maintained at the high level. For this reason, the electric charge of the binary capacitor C6P1 to which the reference signal supplied from the inverter Q6P1 is applied does not move. In other words, the electric potential of the node NP1 does not change. For this reason, the signal level of the analog signal VCP given in accordance with the electric potential of the node NP1 does not change.

In the period T2, the internal clock signal BIT_CLK becomes the low level, and the inverted internal clock signal BIT_CLKb becomes the high level. Accordingly, the comparison circuit 150 becomes inactive. In this case, the comparison circuit 150 outputs the digital signal VOP and the digital signal VON having the low level.

In periods T3 to T8 after the time t4, an operation similar to the operation performed in the period T1 or the period T2 described above is performed. In other words, in the periods T3 to T8, comparisons are sequentially performed. Accordingly, the values of a third bit D5 to the LSB (D0) of the digital signals D0 to D7 are determined. As a result, the digital signals D0 to D7 of which the values of all the bits are determined in accordance with the AD conversions are acquired.

In a period T8, the LSB (D0) is determined. At the same time, the control circuit 160 outputs the digital signals D0 to D7 that are finally acquired through the AD conversions from the output terminal.

At a time t10 when the period T8 ends, the clock signal CLK1 changes from the high level to the low level, and thus, the AD conversion period of the first capacitor DAC circuit 120 ends. At the same time, the clock signal CLK2 changes from the low level to the high level, and thus, a reset period starts. Accordingly, the switch 142P and the switch 142N of the selection circuit 140 are turned on. As a result, the analog signal VAP is applied to the first input terminal of the comparison circuit 150, and the analog signal VAN is input to the second input terminal of the comparison circuit 150. In other words, the comparison circuit 150 is in a reset state.

At a time t11, the sampling signal SH1 changes from the low level to the high level, whereby a first sampling period starts. Accordingly, electric charge corresponding to the electric potentials of the analog signal VAP and the analog signal VAN output from the sampling circuit 110 is sampled in the damping capacitors CHP1 and CHN1 and the binary capacitors C0P1 to C7P1 and C0N1 to C7N1 of the first capacitor DAC circuit 120. In the first sampling period, the analog signal VAP and the analog signal VAN are input to the first capacitor DAC circuit 120 and are sampled in the first capacitor DAC circuit 120.

Meanwhile, at a time t1, the sampling signal SH2 changes from the low level to the high level, and thus a second sampling period starts. Accordingly, the switch 112P and the switch 112N of the sampling circuit 110 are tuned on. For this reason, the analog signal VAP and the analog signal VAN are sampled (tracked) by the sampling circuit 110 and are output to the second capacitor DAC circuit 130. Electric charge corresponding to the electric potentials of the analog signal VAP and the analog signal VAN output from the sampling circuit 110 is sampled in the damping capacitors CHP2 and CHN2 and the binary capacitors C0P2 to C7P2 and C0N2 to C7N2 of the second capacitor DAC circuit 130. In the second sampling period, the analog signal VAP and the analog signal VAN are input to the second capacitor DAC circuit 130 and are sampled in the second capacitor DAC circuit 130.

When the second sampling period starts, bits of the digital signals DP0 to DP7 and the digital signals DN0 to DN7 output from the control circuit 160 are set (initialized) as "0." Thereafter, at a time t11, the sampling signal SH2 changes from the high level to the low level, and thus, the second sampling period ends, and a second holding period starts. In the second holding period of a time t12 to a time t21, an AD conversion is performed. The AD conversion in the second holding period of the time t12 to the time t21 is performed on the basis of the electric charge sampled in the second capacitor DAC circuit 130. The AD conversion performed in the second holding period is similar to the AD conversion performed in the first holding period.

The first capacitor DAC circuit and the second capacitor DAC circuit of the AD converter according to each aspect of the present invention need not include components other than the first capacitors and the second capacitors. A signal that is input to the AD converter according to each aspect of the present invention and is a target for an AD conversion may be a signal other than a video signal. The image sensor according to each aspect of the present invention need not include components other than the plurality of pixels and the AD converter.

In the AD converter 100 according to the first embodiment, in a period in which one of two capacitor DAC circuits performs an AD conversion operation, the other capacitor DAC circuit perform a sampling operation. In this way, the two capacitor DAC circuits of the AD converter 100 can simultaneously perform the sampling operation and the AD conversion operation. For this reason, the AD converter 100 can perform an AD conversion at a high speed. In addition, since the comparison circuit 150 and the control circuit 160 used for performing an AD conversion can be shared by the two capacitor DAC circuits, the chip area can be decreased.

Second Embodiment

Figure 8:
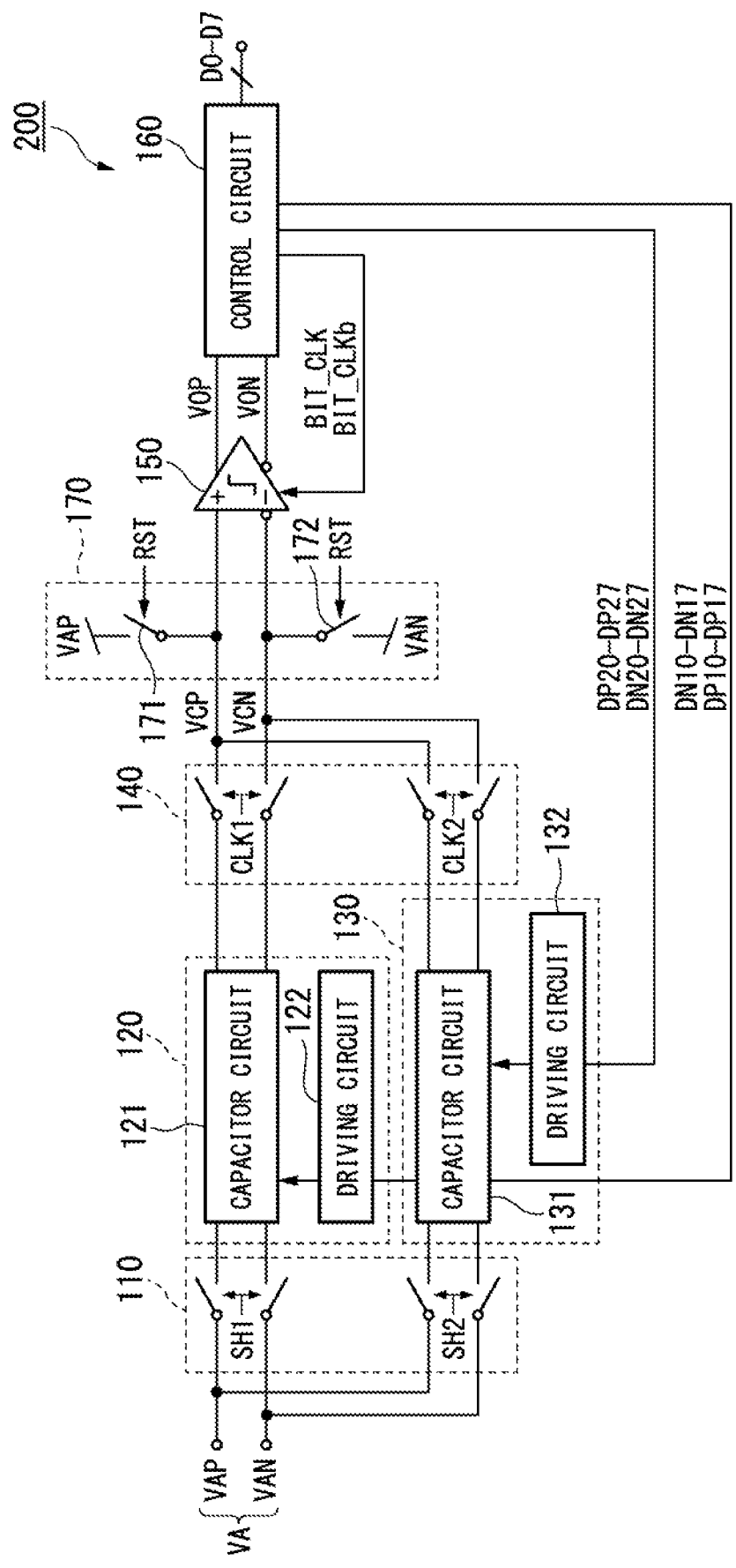
FIG. 8 is a circuit diagram showing the configuration of an AD converter according to a second embodiment of the present invention.

The configuration of an AD converter 200 according to a second embodiment of the present invention will be described with reference to FIG. 8. FIG. 8 shows the configuration of the AD converter 200. In the configuration shown in FIG. 8, points different from those of the configuration shown in FIG. 4 will be described.

The AD converter 200 includes a reset switch 170 in addition to the configuration of the AD converter 100. The reset switch 170 includes a switch 171 and a switch 172.

Each of the switch 171 and the switch 172 includes a first terminal and a second terminal. The first terminal of the switch 171 is connected to a first input terminal of a comparison circuit 150. A second terminal of the switch 171 is connected to the non-inverted input terminal INP shown in FIGS. 5 and 6. When the switch 171 is on, the first terminal and the second terminal of the switch 171 are connected. At this time, an analog signal VAP is input to the first input terminal of the comparison circuit 150. On the other hand, when the switch 171 is off, a high impedance state is formed between the first terminal and the second terminal of the switch 171. The switch 171 samples an analog signal VAP. On and off of the switch 171 are switched between on the basis of a control signal RST.

The first terminal of the switch 172 is connected to a second input terminal of the comparison circuit 150. The second terminal of the switch 172 is connected to the inverted input terminal INN shown in FIGS. 5 and 6. When the switch 172 is on, the first terminal and the second terminal of the switch 172 are connected. At this time, an analog signal VAN is input to the second input terminal of the comparison circuit 150. On the other hand, when the switch 172 is off a high impedance state is formed between the first terminal and the second terminal of the switch 172. The switch 172 samples an analog signal VAN. On and off of the switch 172 are switched between on the basis of the control signal RST. In the configuration shown in FIG. 8, points other than the points described above are similar to those of the configuration shown in FIG. 4. The image sensor IMG according to the first embodiment may include the AD converter 200 instead of the AD converter 100.

Figure 9:
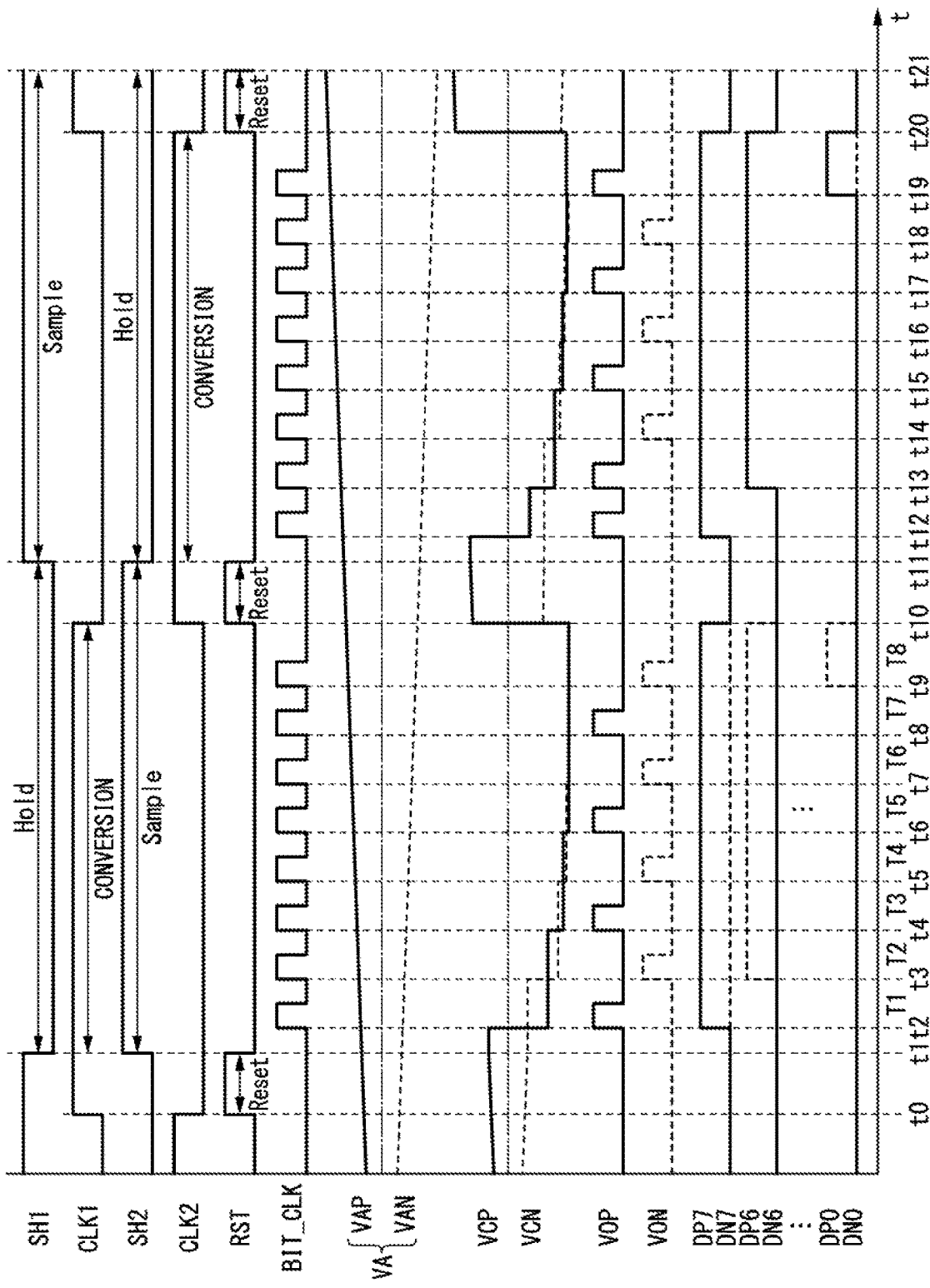
FIG. 9 is a timing diagram showing an operation of an AD converter according to the second embodiment of the present invention.

The operation of the AD converter 200 will be described with reference to FIG. 9. FIG. 9 shows signals relating to the operation of the AD converter 200. In FIG. 9, the control signal RST is added to the signals shown in FIG. 7. In FIG. 9, signals other than the control signal RST are the same as the signals shown in FIG. 7. In the operation shown in FIG. 9, points different from the operation shown in FIG. 7 will be described.

At a time t0, the control signal RST changes from the low level to the high level, and thus, the switch 171 and the switch 172 of the reset switch 170 are turned on. Accordingly, an analog signal VAP is applied to the first input terminal of the comparison circuit 150, and an analog signal VAN is applied to the second input terminal of the comparison circuit 150. In other words, the comparison circuit 150 is in a reset state. At a time t1, the control signal RST changes from the high level to the low level, and accordingly, the switch 171 and the switch 172 of the reset switch 170 are turned off. In this way, the resetting of the comparison circuit 150 ends.

At a time t10 to a time t11 and a time t20 to a time t21, the control signal RST is at the high level. At this time, the comparison circuit 150 is in the reset state. In the operation shown in FIG. 9, points other than those described above are similar to those of the operation shown in FIG. 7.

The AD converter 200 includes a first node (non-inverted input terminal INP) and a second node (inverted input terminal INN) to which a differential signal VA is input. The AD converter 200 includes a reset switch 170 (connection switch) that is switched between on and off. The first input node of the first capacitor DAC circuit 120 and the first input node (the node NP1 and the node NP2) of the second capacitor DAC circuit 130 are electrically connected to the first node. The second input node of the first capacitor DAC circuit 120 and the second input node (the node NN1 and the node NN2) of the second capacitor DAC circuit 130 are electrically connected to the second node. The reset switch 170 is on only in a reset operation. Only in a reset operation, the reset switch 170 connects the first node and the first input terminal of the comparison circuit 150 and connects the second node and the second input terminal of the comparison circuit 150.

When a reset operation is performed in the AD converter 100 according to the first embodiment, an analog signal VAP input to the non-inverted input terminal INP is input to the first input terminal of the comparison circuit 150 through two switches. The two switches are the switch 111P of the sampling circuit 110 and the switch 141P of the selection circuit 140. Alternatively, the two switches are the switch 112P of the sampling circuit 110 and the switch 142P of the selection circuit 140. When a reset operation is performed in the AD converter 100 according to the first embodiment, an analog signal VAN input to the inverted input terminal INN is input to the second input terminal of the comparison circuit 150 through two switches. The two switches are the switch 111N of the sampling circuit 110 and the switch 141N of the selection circuit 140. Alternatively, the two switches are the switch 112N of the sampling circuit 110 and the switch 142N of the selection circuit 140.

When a reset operation is performed in the AD converter 200 according to the second embodiment, an analog signal VAP input to the non-inverted input terminal INP is input to the first input terminal of the comparison circuit 150 through only one switch 171. When a reset operation is performed in the AD converter 200 according to the second embodiment, an analog signal VAN input to the inverted input terminal INN is input to the second input terminal of the comparison circuit 150 through only one switch 172.

Accordingly, when a reset operation is performed in the AD converter 200 according to the second embodiment, the on-resistance value of a switch connected between the input terminal of the AD converter 200 and the input terminal of the comparison circuit 150 decreases. For this reason, a settling time of the analog signal VCP and the analog signal VCN input to the comparison circuit 150 is shortened, and the AD converter 200 can be operated at a higher speed.

While preferred embodiments of the invention have been described and shown above, it should be understood that these are exemplars of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An AD converter comprising:
a first capacitor DAC circuit, to which a differential signal is input from a first node and a second node, including a plurality of first capacitors having weighted capacitance values;
a second capacitor DAC circuit, to which the differential signal is input from the first node and the second node at a timing different from a timing at which the differential signal is input to the first capacitor DAC circuit, including a plurality of second capacitors having weighted capacitance values;
a selection circuit configured to select one of the first capacitor DAC circuit and the second capacitor DAC circuit and perform switching between a first state in which the first capacitor DAC circuit is selected and a second state in which the second capacitor DAC circuit is selected;
a comparison circuit having a first input terminal and a second input terminal respectively connected to a first output node and a second output node of one of the first capacitor DAC circuit and the second capacitor DAC circuit through the selection circuit and configured to compare an electric potential of the first output node with an electric potential of the second output node;
a control circuit configured to control the first capacitor DAC circuit and the second capacitor DAC circuit in accordance with a result of the comparison performed by the comparison circuit; and
a connection switch configured to be switched between on and off, configured to connect the first node and the first input terminal when being on, and connect the second node and the second input terminal when being off,
wherein the first capacitor DAC circuit is configured to perform a first operation in parallel with a second operation by the second capacitor DAC circuit, the first capacitor DAC circuit configured to perform the second operation in parallel with the first operation by the second capacitor DAC circuit, electric charge corresponding to an input signal for the first capacitor DAC circuit or the second capacitor DAC circuit being sampled in each first capacitor included in the plurality of first capacitors or each second capacitor included in the plurality of second capacitors in the first operation, and AD conversions being sequentially performed on the basis of the electric charge sampled in each first capacitor included in the plurality of first capacitors or each second capacitor included in the plurality of second capacitors in the second operation,
the first capacitor DAC circuit and the second capacitor DAC circuit are configured to alternately perform the first operation and the second operation,
the selection circuit is configured to select a capacitor DAC circuit performing the second operation out of the first capacitor DAC circuit and the second capacitor DAC circuit, and
the connection switch is configured to be turned on between the first operation and the second operation and perform a reset operation of applying a reference voltage to the first input terminal and the second input terminal.

2. An image sensor comprising:
the AD converter according to claim 1; and
a plurality of pixels disposed in a matrix pattern,
wherein the plurality of pixels are configured to output signals, and
the differential signal based on the signals output from the plurality of pixels is input to the AD converter.

* * * * *